United States Patent
Kawana et al.

(10) Patent No.: US 10,363,608 B2
(45) Date of Patent: Jul. 30, 2019

(54) COPPER PASTE FOR JOINING, METHOD FOR PRODUCING JOINED BODY, AND METHOD FOR PRODUCING SEMICONDUCTOR DEVICE

(71) Applicant: HITACHI CHEMICAL COMPANY, LTD., Tokyo (JP)

(72) Inventors: Yuki Kawana, Tokyo (JP); Kazuhiko Kurafuchi, Tokyo (JP); Yoshinori Ejiri, Tokyo (JP); Hideo Nakako, Tokyo (JP); Chie Sugama, Tokyo (JP); Dai Ishikawa, Tokyo (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 15/757,790

(22) PCT Filed: Sep. 7, 2016

(86) PCT No.: PCT/JP2016/076343
§ 371 (c)(1),
(2) Date: Mar. 6, 2018

(87) PCT Pub. No.: WO2017/043545
PCT Pub. Date: Mar. 16, 2017

(65) Prior Publication Data
US 2018/0250751 A1    Sep. 6, 2018

(30) Foreign Application Priority Data
Sep. 7, 2015    (JP) .................................. 2015-176068

(51) Int. Cl.
*H01L 21/52*    (2006.01)
*B22F 7/08*    (2006.01)
(Continued)

(52) U.S. Cl.
CPC ................ *B22F 7/08* (2013.01); *B22F 1/00* (2013.01); *B22F 1/0018* (2013.01);
(Continued)

(58) Field of Classification Search
CPC ......... H01L 21/52; H01L 24/27; H01L 24/32; B22F 7/08; B22F 1/00; B22F 1/0018; B22F 1/0055; C04B 37/00; H01B 1/22
See application file for complete search history.

(56) References Cited

U.S. PATENT DOCUMENTS 5,611,884 A * 3/1997 Bearinger .............. C09J 183/04
156/325
5,863,664 A * 1/1999 McCormick ............ B32B 27/06
428/500

(Continued)

FOREIGN PATENT DOCUMENTS

JP    4928639 B2    12/2011
JP    5006081 B2    8/2012

(Continued)

OTHER PUBLICATIONS

R. Khazaka, L. Mendizabal, and D. Henry, "Review on Joint Shear Strength of Nano-Silver Paste and Its Long-Term High Temperature Reliability", Journal of Electronic Materials, 2014 vol. 43, No. 7, p. 2459-p. 2466.

(Continued)

*Primary Examiner* — Ida M Soward
(74) *Attorney, Agent, or Firm* — Fitch, Even, Tabin & Flannery, LLP

(57) ABSTRACT

Provided is copper paste for joining including metal particles, and a dispersion medium. The metal particles include sub-micro copper particles having a volume-average particle size of 0.12 μm to 0.8 μm, and micro copper particles having a volume-average particle size of 2 μm to 50 μm, a sum of (Continued)

the amount of the sub-micro copper particles contained and the amount of the micro copper particles contained is 80% by mass or greater on the basis of a total mass of the metal particles, and the amount of the sub-micro copper particles contained is 30% by mass to 90% by mass on the basis of a sum of a mass of the sub-micro copper particles and a mass of the micro copper particles.

9 Claims, 13 Drawing Sheets

(51) Int. Cl.
  B22F 1/00 (2006.01)
  C04B 37/00 (2006.01)
  H01B 1/22 (2006.01)
  H01L 23/00 (2006.01)
(52) U.S. Cl.
  CPC ............ *B22F 1/0055* (2013.01); *C04B 37/00* (2013.01); *H01B 1/22* (2013.01); *H01L 21/52* (2013.01); *H01L 24/27* (2013.01); *H01L 24/32* (2013.01); *B22F 2001/0033* (2013.01); *B22F 2301/10* (2013.01); *B22F 2304/056* (2013.01); *B22F 2304/058* (2013.01); *B22F 2304/10* (2013.01); *B22F 2998/00* (2013.01); *H01L 2224/33* (2013.01); *H01L 2224/371* (2013.01); *H01L 2224/40137* (2013.01); *H01L 2224/40225* (2013.01); *H01L 2224/40245* (2013.01); *H01L 2224/48091* (2013.01); *H01L 2224/48227* (2013.01); *H01L 2224/48247* (2013.01); *H01L 2224/73265* (2013.01); *H01L 2924/01029* (2013.01); *H01L 2924/181* (2013.01)

(56) References Cited

U.S. PATENT DOCUMENTS

| | | | | |
|---|---|---|---|---|
| 7,848,007 B2* | 12/2010 | Paolini, Jr. | ............... | G02F 1/167 359/296 |
| 8,647,983 B2* | 2/2014 | Di Cioccio | ......... | B81C 1/00269 438/118 |
| 8,840,811 B2* | 9/2014 | Yasuda | ................. | B22F 1/0074 228/194 |
| 9,390,829 B2* | 7/2016 | Yoshida | ................... | H01B 1/22 |
| 9,701,874 B2* | 7/2017 | Uchida | ............. | C09D 133/068 |
| 2006/0145352 A1* | 7/2006 | Soga | .................... | H05K 3/3484 257/772 |
| 2006/0163744 A1* | 7/2006 | Vanheusden | ........... | B82Y 30/00 257/773 |
| 2006/0211280 A1* | 9/2006 | Igarashi | ............... | G01R 1/0735 439/91 |
| 2010/0051319 A1* | 3/2010 | Schmitt | .............. | B23K 35/3006 174/126.1 |
| 2013/0136645 A1* | 5/2013 | Sekine | .................. | B82B 3/0038 419/8 |
| 2013/0230719 A1* | 9/2013 | Pike-Biegunski | ... | B01J 13/0043 428/402 |
| 2014/0287158 A1* | 9/2014 | Heyen | .................... | H05K 1/095 427/555 |
| 2014/0287159 A1* | 9/2014 | Carmody | ................. | C09D 5/24 427/555 |
| 2015/0136219 A1* | 5/2015 | Koike | ............. | H01L 31/022425 136/256 |
| 2016/0226065 A1* | 8/2016 | Karabacak | ........... | H01M 4/485 |
| 2017/0306170 A1* | 10/2017 | Leamon | .................... | B22F 9/20 |
| 2018/0102271 A1* | 4/2018 | Jinbo | ................. | H01L 27/1214 |

FOREIGN PATENT DOCUMENTS

| | | |
|---|---|---|
| JP | 2013-247060 A | 12/2013 |
| JP | 2014-167145 A | 9/2014 |
| WO | 2008/062548 A1 | 5/2008 |

OTHER PUBLICATIONS

Katsuhiro Ueda, Sumio Inafuku, Iwao Mori, "Obtainment of Sectional Area of Stearic Acid Molecule—Experimental Value and Calculated Value—", Chemistry & Education, 1992, vol. 40 No. 2, p. 114-p. 117.

* cited by examiner

COPPER PASTE FOR JOINING, METHOD FOR PRODUCING JOINED BODY, AND METHOD FOR PRODUCING SEMICONDUCTOR DEVICE

CROSS-REFERENCE TO RELATED APPLICATIONS

This application is a U.S. national phase application filed under 35 U.S.C. § 371 of International Application No. PCT/JP2016/076343, filed Sep. 7, 2016, which claims priority from Japanese Patent Application No. 2015-176068, filed Sep. 7, 2015, designating the United States, which are hereby incorporated herein by reference in their entirety.

TECHNICAL FIELD

The present invention relates to copper paste for joining, a method for manufacturing a joined body and a method for manufacturing a semiconductor device by using the copper paste for joining, a joined body, and a semiconductor device.

BACKGROUND ART

When manufacturing semiconductor devices, various joining materials are used to join a semiconductor element and a lead frame and the like (support member). When joining a power semiconductor, an LSI, and the like, which are operated at a high temperature of 150° C. or higher, among the semiconductor devices, high-melting-point lead solder is used as a joining material. In recent, an operation temperature rises up to approximately the melting point of the high-melting-point lead solder due to large capacity and space saving of a semiconductor element, and thus it is difficult to secure connection reliability. On the other hand, a joining material, which does not contain lead, is demanded in accordance with strengthening of RoHS regulations.

Joining of a semiconductor element by using a material other than lead solder has been examined. For example, Patent Literature 1 suggests a technology of forming a sintered silver layer by sintering silver nanoparticles at a low temperature. It is known that the sintered silver has high connection reliability with respect to a power cycle (Non Patent Literature 1).

A technology of forming a sintered copper layer by sintering copper particles as another material is also suggested. For example, Patent Literature 2 discloses paste for joining which includes a cupric oxide particles and a reducing agent as a joining material for joining a semiconductor element and an electrode. In addition, Patent Literature 3 discloses a joining material that includes copper nano particles, and copper micro particles, copper sub-micro particles, or both of the copper micro particles and the copper sub-micro particles.

CITATION LIST

Patent Literature

Patent Literature 1: Japanese Patent No. 4928639
Patent Literature 2: Japanese Patent No. 5006081
Patent Literature 3: Japanese Unexamined Patent Publication No. 2014-167145

Non Patent Literature

Non Patent Literature 1: R. Khazaka, L. Mendizabal, D. Henry: J. ElecTron. Mater, 43(7), 2014, 2459-2466

SUMMARY OF INVENTION

Technical Problem

A method described in Patent Literature 1, densification of the sintered silver layer is essential to obtain high connection reliability, and thus a thermal compression process accompanied with pressurization is necessary. In the case of performing the thermal compression process accompanied with pressurization, there is a problem such as deterioration of production efficiency, and deterioration of yield ratio. In addition, in the case of using the silver nano particles, there is a problem that the material cost significantly increases due to silver.

In a method described in Patent Literature 2, volume shrinkage when copper oxide is reduced into copper is avoided by the thermal compression process. However, the above-described problem exists in the thermal compression process.

In a method described in Patent Literature 3, sintering is performed without pressurization, but the method is not sufficient in practical use due to the following viewpoints. Specifically, it is necessary to modify a surface of copper nano particles with a protective agent to suppress oxidation and to improve dispersibility. However, the copper nano particles have a large specific surface area, and thus the amount of the surface protective agent blended tends to increase in a joining material including the copper nano particles as a main component. In addition, the amount of a dispersion medium blended tends to increase so as to secure dispersibility. Accordingly, in the joining material described in Patent Literature 3, a ratio of the surface protective agent or the dispersion medium is increased for supply stability in storage, coating, and the like. Accordingly, volume shrinkage in sintering is likely to increase, and densification after sintering is likely to decrease. As a result, it is difficult to secure the strength of a sintered body.

An object of the invention is to provide copper paste for joining capable of obtaining sufficient joining strength even in the case of performing joining without pressurization. Another object of the invention is to provide a method for manufacturing a joined body and a method for manufacturing a semiconductor device by using the copper paste for joining, a joined body, and a semiconductor device.

Solution to Problem

According to an aspect of the invention, there is provided copper paste for joining including metal particles, and a dispersion medium. The metal particles include sub-micro copper particles having a volume-average particle size of 0.12 μm to 0.8 μm, and micro copper particles having a volume-average particle size of 2 μm to 50 μm, a sum of the amount of the sub-micro copper particles contained and the amount of the micro copper particles contained is 80% by mass or greater on the basis of a total mass of the metal particles, and the amount of the sub-micro copper particles contained is 30% by mass to 90% by mass on the basis of a sum of a mass of the sub-micro copper particles and a mass of the micro copper particles.

According to the copper paste for joining of the invention, even in the case of performing joining without pressurization, it is possible to obtain sufficient joining strength. The reason why the effect is obtained is considered to be because when the sub-micro copper particles and the micro copper particles are contained in a specific ration, it is possible to sufficiently suppress volume shrinkage in sintering due to a surface protective agent or a dispersion medium while maintaining sufficient sinterability, and securement of the strength of a sintered body and an improvement of a joining force with a joining surface are accomplished. In addition, since the above-described effect can be obtained due to the sub-micro copper particles and the micro copper particles, the copper paste for joining of the invention has an advantage capable of being more cheaply and more stably supplied in comparison to a joining material including expensive copper nano particles as a main component. According to this, for example, in the case of manufacturing a joined body such as a semiconductor device, it is possible to further enhance production stability.

In the copper paste for joining, the micro copper particles may have a flake shape. In the case of using the flake-shaped micro copper particles, for example, it is easier to improve die shear strength and connection reliability in a semiconductor device in an easier manner. Furthermore, the reason why the effect is obtained is considered as follows. The micro copper particles in the copper paste for joining are oriented in approximately parallel to a joining surface, and thus it is possible to suppress volume shrinkage when sintering the copper paste for joining. In addition, an overlapping area of the flake-shaped micro copper particles increases, and thus a joining force is improved. In addition, the flake-shaped micro copper particles arrange the sub-micro copper particles, and thus a reinforcing effect is obtained.

The copper paste for joining of the invention may be used without pressurization. In this specification, "without pressurization" represents a state of receiving own weight of a member to be joined, or a pressure of 0.01 MPa or lower in addition to the own weight.

According to another aspect of the invention, there is provided a method for manufacturing a joined body. The method includes a process of preparing a laminated body in which a first member, and the copper paste for joining and a second member that are disposed on a side whereon a weight of the first member acts, are laminated in this order; and sintering the copper paste for joining in a state of receiving the weight of the first member, or the weight of the first member and a pressure of 0.01 MPa or lower.

According to the method for manufacturing a joined body according to the invention, the copper paste for joining is used, and thus it is possible to manufacture a joined body in which members are joined at a sufficient joining force through joining without pressurization.

According to still another aspect of the invention, there is provided a method for manufacturing a semiconductor device. The method includes a process of preparing a laminated body in which a first member, and the copper paste for joining and a second member that are disposed on a side whereon a weight of the first member acts, are laminated in this order; and sintering the copper paste for joining in a state of receiving the weight of the first member, or the weight of the first member and a pressure of 0.01 MPa or lower. At least one of the first member and the second member is a semiconductor element.

According to the method for manufacturing a semiconductor device according to the invention, since the copper paste for joining is used, it is possible to manufacture a semiconductor device that is excellent in die shear strength through the joining without pressurization. In addition, a semiconductor device, which is manufactured by the method for manufacturing a semiconductor device according to the invention, is excellent in connection reliability.

According to still another aspect of the invention, there is provided a joined body including a first member, a second member, and a sintered body of the copper paste for joining that joins the first member and the second member. In the joined body of the invention, the first member and the second member are joined through the copper sintered body having a sufficient joining force. In addition, the joined body of the invention includes the copper sintered body excellent in thermal conductivity, and thus the joined body is excellent in heat dissipation of a member.

In the joined body, at least one of the first member and the second member may include at least one metal selected from the group consisting of copper, nickel, silver, gold, and palladium on a surface that is in contact with the sintered body. In this case, it is possible to further enhance adhesiveness between at least one of the first member and the second member, and the sintered body.

According to still another aspect of the invention, there is provided a semiconductor device including a first member, a second member, and a sintered body of the copper paste for joining that joins the first member and the second member. At least one of the first member and the second member is a semiconductor element. Since the semiconductor device of the invention includes the copper sintered body that has a sufficient joining force, and high thermal conductivity and melting point, the semiconductor device has sufficient die shear strength, and is excellent in connection reliability and power cycle resistance.

Advantageous Effects of Invention

According to the invention, it is possible to provide copper paste for joining capable of obtaining sufficient joining strength even in the case of performing joining without pressurization. In addition, according to the invention, it is possible to provide a method for manufacturing a joined body and a method for manufacturing a semiconductor device by using the copper paste for joining, a joined body, and a semiconductor device.

DESCRIPTION OF EMBODIMENTS

Figure 1:
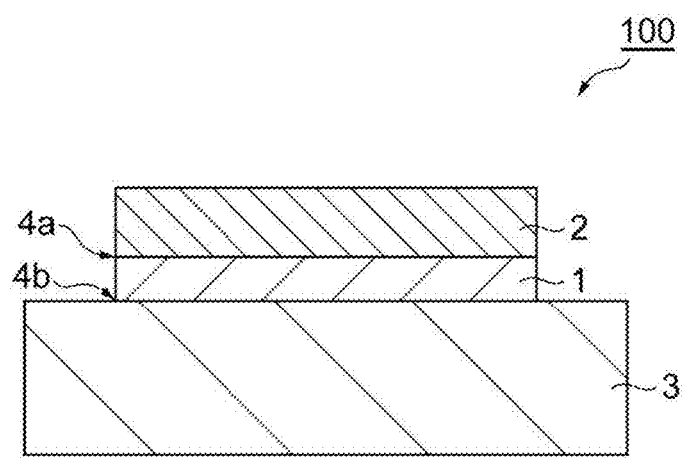
FIG. 1 is a schematic cross-sectional view illustrating an example of a joined body that is manufactured by using copper paste for joining according to this embodiment.

Hereinafter, a mode for carrying out the invention (hereinafter, referred to as "this embodiment") will be described in detail. The invention is not limited to the following embodiment.

<Copper Paste for Joining>

Copper paste for joining according to this embodiment is copper paste for joining that includes metal particles and a dispersion medium. The metal particles include sub-micro copper particles and micro copper particles.

(Metal Particles)

Examples of the metal particles according to this embodiment include the sub-micro copper particles, the micro copper particles, other metal particles other than copper particles, and the like.

(Sub-Micro Copper Particles)

Examples of the sub-micro copper particles include sub-micro copper particles including copper particles having a particle size of 0.12 µm to 0.8 µm. For example, copper particles having a volume-average particle size of 0.12 µm to 0.8 µm can be used. When the volume-average particle size of the sub-micro copper particles is 0.12 µm or greater, it is easy to obtain an effect such as suppression of the synthesizing cost of the sub-micro copper particles, satisfactory dispersibility, and suppression of the amount of surface treatment agent that is used. When the volume-average particle size of the sub-micro copper particles is 0.8 µm or less, it is easy to obtain an effect such as excellent sinterability of the sub-micro copper particles. From the viewpoint of further obtaining the effect, the volume-average particle size of the sub-micro copper particles may be 0.15 µm to 0.8 µm, 0.15 µm to 0.6 µm, 0.2 µm to 0.5 µm, or 0.3 µm to 0.45 µm.

Furthermore, the volume-average particle size in this specification represents 50% volume-average particle size. When obtaining the volume-average particle size of the copper particles, the volume-average particle size can be obtained by the following method. Specifically, copper particles which become a raw material, or dry copper particles obtained by removing a volatile component from the copper paste for joining are dispersed in a dispersion medium by using a dispersing agent, and the volume-average particle size of the resultant dispersed material is measured by using a light-scattering method particle size distribution measuring apparatus (for example, a shimadzu nano particle size distribution measuring apparatus (SALD-7500 nano, manufactured by Shimadzu Corporation), and the like. In the case of using the light-scattering method particle size distribution measuring apparatus, as the dispersion medium, hexane, toluene, α-terpineol, and the like can be used.

The sub-micro copper particles can include copper particles having a particle size of 0.12 µm to 0.8 µm in an amount of 10% by mass or greater. From the viewpoint of sinterability of the copper paste for joining, the sub-micro copper particles can include the copper particles having a particle size of 0.12 µm to 0.8 µm in an amount of 20% by mass or greater, 30% by mass or greater, or 100% by mass. When the content ratio of the copper particles having a particle size of 0.12 µm to 0.8 µm is 20% by mass or greater in the sub-micro copper particles, the dispersibility of the copper particles is further improved, and it is possible to further suppress an increase in viscosity and a decrease in paste concentration.

The particle size of the copper particles can be obtained by the following method. The particle size of the copper particles can be calculated, for example, from a SEM image. A powder of the copper particles is placed on a carbon tape for SEM by using a spatula, and is set as a sample for SEM. The sample for SEM is observed by a SEM apparatus at a magnification of 5000 times. A rectangle that is circumscribed to a copper particle on the SEM image is drawn by using image processing software, and one side of the rectangle is set as a particle size of the particle.

The amount of the sub-micro copper particles contained may be 20% by mass to 90% by mass on the basis of the total mass of metal particles, 30% by mass to 90% by mass, 35% by mass to 85% by mass, or 40% by mass to 80% by mass. When the amount of the sub-micro copper particles contained is in the above-described range, it is easy to secure the joining strength of a joined body that is manufactured by sintering the copper paste for joining. In the case of using the copper paste for joining in joining of a semiconductor element, when the amount of the sub-micro copper particles contained is in the above-described range, a semiconductor device tends to exhibit satisfactory die shear strength, and connection reliability.

The amount of the sub-micro copper particles contained is preferably 20% by mass to 90% by mass on the basis of the sum of the mass of the sub-micro copper particles and the mass of the micro copper particles. When the amount of the sub-micro copper particles contained is 20% by mass or greater, a space between the micro copper particles can be sufficiently filled with the sub-micro copper particles, and it is easy to secure the joining strength of a joined body that is manufactured by sintering the copper paste for joining. In the case of using the copper paste for joining in joining of a semiconductor element, a semiconductor device tends to exhibit satisfactory die shear strength and connection reliability. When the amount of the sub-micro copper particles contained is 90% by mass or less, it is possible to sufficiently suppress volume shrinkage when sintering the copper paste for joining, and thus it is easy to secure the joining strength of a joined body that is manufactured by sintering the copper paste for joining. In the case of using the copper paste for joining in joining of a semiconductor element, when the amount of the sub-micro copper particles contained is 90% by mass or less, a semiconductor device tends to exhibit satisfactory die shear strength and connection reliability. From the viewpoint of further obtaining the effect, the amount of the sub-micro copper particles contained may be 30% by mass to 85% by mass on the basis of the sum of the mass of the sub-micro copper particles and the mass of the micro copper particles, 30% by mass to 85% by mass, 35% by mass to 85% by mass, or 40% by mass to 80% by mass.

A shape of the sub-micro copper particles is not particularly limited. Examples of the shape of the sub-micro copper particles include a spherical shape, a bulky shape, a needle shape, a flake shape, an approximately spherical shape, and an aggregate thereof. From the viewpoints of dispersibility and filling properties, the shape of the sub-micro copper particles may be the spherical shape, the approximately spherical shape, or the flake shape, and from the viewpoints of combustibility, dispersibility, mixability with flake-shaped micro particles, and the like, the shape of the sub-micro copper particles may be the spherical shape or the approximately spherical shape. In this specification, the "flake shape" includes a flat plate shape such as a plate shape and a squamous shape.

From the viewpoints of dispersibility, filling properties, and mixability with flake-shaped micro particles, an aspect ratio of the sub-micro copper particles may be 5 or less, or 3 or less. In this specification, the "aspect ratio" represents a ratio of a long side/thickness of particles. The long side and the thickness of particles can be measured and obtained, for example, from a SEM image of particles.

The sub-micro copper particles may be treated with a specific surface treatment agent. Examples of the specific surface treatment agent include an organic acid having 8 to 16 carbon atoms. Examples of the organic acid having 8 to 16 carbon atoms include saturated patty acids such as caprylic acid, methylheptanoic acid, ethylhexanoic acid, propylpentanoic acid, pelargonic acid, methyloctanoic acid, ethylheptanoic acid, propylhexanoic acid, capric acid, methylnonanoic acid, ethyloctanoic acid, propylheptanoic acid, butylhexanoic acid, undecanoic acid, methyldecanoic acid, ethyl nonanoic acid, propyloctanoic acid, butylheptanoic acid, lauric acid, methylundecanoic acid, ethyldecanoic acid, propylnonanoic acid, butyloctanoic acid, pentylheptanoic acid, tridecanoic acid, methyldodecanoic acid, ethyl undecanoic acid, propyldecanoic acid, butylnonanoic acid, pentyloctanoic acid, myristic acid, methyltridecanoic acid, ethyldodecanoic acid, propylundecanoic acid, butyldecanoic acid, pentylnonanoic acid, hexyloctanoic acid, pentadecanoic acid, methyltetradecanoic acid, ethyltridecanoic acid, propyldodecanoic acid, butyl undecanoic acid, pentyldecanoic acid, hexylnonanoic acid, palmitic acid, methylpentadecanoic acid, ethyltetradecanoic acid, propyltridecanoic acid, butyldodecanoic acid, pentylundecanoic acid, hexyldecanoic acid, heptylnonanoic acid, methyl cyclohexane carboxylic acid, ethyl cyclohexane carboxylic acid, propyl cyclohexane carboxylic acid, butyl cyclohexane carboxylic acid, pentyl cyclohexane carboxylic acid, hexyl cyclohexane carboxylic acid, heptyl cyclohexane carboxylic acid, octyl cyclohexane carboxylic acid, and nonyl cyclohexane carboxylic acid; unsaturated patty acid such as octenoic acid, nonenoic acid, methylnonenoic acid, decenoic acid, undecenoic acid, dodecenoic acid, tridecenoic acid, tetradecenoic acid, myristoleic acid, pentadecenoic acid, hexadecenoic acid, palmitoleic acid, and sabic acid; and aromatic carboxylic acids such as terephthalic acid, pyromellitic acid, o-phenoxybenzoic acid, methylbenzoic acid, ethylbenzoic acid, propylbenzoic acid, butylbenzoic acid, pentylbenzoic acid, hexylbenzoic acid, heptylbenzoic acid, octylbenzoic acid, and nonylbenzoic acid. The organic acids may be used alone or in combination of two or more kinds thereof. When the organic acids and the sub-micro copper particles are combined, there is a tendency that dispersibility of the sub-micro copper particles and removal properties of the organic acids in sintering are compatible with each other.

A treatment amount of the surface treatment agent may an amount in which one molecular layer to three molecular layers adhere to a surface of the sub-micro copper particles. The amount can be calculated from the number of molecular layers (n) adhered to a surface of the sub-micro copper particles, a specific surface area ($A_p$) (unit: m$^2$/g) of the sub-micro copper particles, the molecular weight ($M_s$) (unit: g/mol) of the surface treatment agent, a minimum covering area ($S_s$) (unit: m$^2$/piece) of the surface treatment agent, and Avogadro's number ($N_A$) ($6.02 \times 10^{23}$). Specifically, the treatment amount of the surface treatment agent is calculated in accordance with the following expression.

The treatment amount of the surface treatment agent
(% by mass)=$\{(n \cdot A_p \cdot M_s)/(S_s \cdot N_A + n \cdot A_p \cdot M_s)\} \times$ 100%

The specific surface area of the sub-micro copper particles can be calculated by measuring the sub-micro copper particles which are dried with a BET specific surface area measurement method. In a case where the surface treatment agent is a straight-chain saturated patty acid, the minimum covering area of the surface treatment agent is $2.05 \times 10^{-19}$ m$^2$/one molecular. In the case of the other surface treatment agents, for example, the minimum covering area can be measured through calculation from a molecular model, or by a method described in "Chemical and Education" (UEDA KATSUHIRO, INAFUKU SUMIO, and MORI IWAO, 40(2), 1992, pages 114 to 117. An example of a quantitative method of the surface treatment agent will be described. The surface treatment agent can be identified by a thermal desorption gas and gas chromatography mass analyzer of a dry powder obtained by removing the dispersion medium from the copper paste for joining, and according to this, it is possible to determine the number of carbons and the molecular weight of the surface treatment agent. A carbon content ratio of the surface treatment agent can be analyzed through carbon content analysis. Examples of the carbon content analysis method include a high-frequency induction heating furnace combustion and infrared absorption method. The amount of the surface treatment agent can be calculated from the number of carbons, the molecular weight, and the carbon content ratio of the surface treatment agent that is identified in accordance with the above-described expression.

The treatment amount of the surface treatment agent may be 0.07% by mass to 2.1% by mass, 0.10% by mass to 1.6% by mass, or 0.2% by mass to 1.1% by mass.

Since the sub-micro copper particles have satisfactory sinterability, it is possible to reduce problems related to an expensive synthesizing cost, unsatisfactory dispersibility, and a decrease in volume shrinkage after sintering which are shown in a joining material that mainly uses copper nano particles.

As the sub-micro copper particles according to this embodiment, commercially available sub-micro copper particles can be used. Examples of the commercially available sub-micro particles include CH-0200 (manufactured by MITSUI MINING & SMELTING CO., LTD., volume-average particle size: 0.36 µm), HT-14 (manufactured by MITSUI MINING & SMELTING CO., LTD., volume-average particle size: 0.41 µm), CT-500 (manufactured by MITSUI MINING & SMELTING CO., LTD., volume-average particle size: 0.72 μm), and Tn-Cu100 (manufactured by TAIYO NIPPON SANSO CORPORATION, volume-average particle size: 0.12 μm).

(Micro Copper Particles)

Examples of the micro copper particles include micro copper particles including copper particles having a particle size of 2 μm to 50 μm, and for example, copper particles having a volume-average particle size of 2 μm to 50 μm can be used. When the volume-average particle size of the micro copper particles is within the above-described range, it is possible to sufficiently reduce volume shrinkage when sintering the copper paste for joining, and it is easy to secure joining strength of a joined body that is manufactured by sintering the copper paste for joining. In the case of using the copper paste for joining in joining of a semiconductor element, when the volume-average particle size of the micro copper particles is within the above-described range, a semiconductor device tends to exhibit satisfactory die shear strength and connection reliability. From the viewpoint of further obtaining the above-described effect, the volume-average particle size of the micro copper particles may be 3 μm to 20 μm, or 3 μm to 10 μm.

The micro copper particles can include copper particles having a particle size of 2 μm to 50 μm in an amount of 50% by mass or greater. From the viewpoints of orientation in a joined body, a reinforcing effect, and filling properties of joining paste, the micro copper particles can include copper particles having a particle size of 2 μm to 50 μm in an amount of 70% by mass or greater, 80% by mass or greater, or 100% by mass. From the viewpoint of suppressing joining failure, for example, it is preferable that the micro copper particles do not include particles, which has a size greater than a joining thickness, such as particles having the maximum particle size greater than 20 μm.

The amount of the micro copper particles contained may be 10% by mass to 90% by mass, 15% by mass to 65% by mass, or 20% by mass to 60% by mass on the basis of the total mass of the metal particles. When the amount of the micro copper particles contained is within the above-described range, it is easy to secure joining strength of a joined body that is manufactured by sintering the copper paste for joining. In the case of using the copper paste for joining in joining of a semiconductor element, when the amount of the micro copper particles contained is in the above-described range, a semiconductor device tends to exhibit satisfactory die shear strength and connection reliability.

The sum of the amount of the sub-micro copper particles contained and the amount of micro copper particles contained can be set to 80% by mass or greater on the basis of the total mass of the metal particles. When the sum of the amount of the sub-micro copper particles contained and the amount of the micro copper particles contained is within the above-described range, it is possible to sufficiently reduce volume shrinkage when sintering the copper paste for joining, and it is easy to secure joining strength of a joined body that is manufactured by sintering the copper paste for joining. In the case of using the copper paste for joining in joining of a semiconductor element, a semiconductor device tends to exhibit satisfactory die shear strength and connection reliability. From the viewpoint of further obtaining the above-described effect, the sum of the amount of the sub-micro copper particles contained and the amount of the micro copper particles contained may be 90% by mass or greater, 95% by mass or greater, or 100% by mass on the basis of the total mass of the metal particles.

A shape of the micro copper particles is not particularly limited. Examples of the shape of the micro copper particles include a spherical shape, a bulky shape, a needle shape, a flake shape, an approximately spherical shape, and an aggregate thereof. Among these, the flake shape is preferable as the shape of the micro copper particles. When using the flake-shaped micro copper particles, the micro copper particles in the copper paste for joining are oriented in approximately parallel to a joining surface, and thus it is possible to suppress volume shrinkage when sintering the copper paste for joining, and it is easy to secure the joining strength of a joined body that is manufactured by sintering the copper paste for joining. In the case of using the copper paste for joining in joining of a semiconductor element, a semiconductor device tends to exhibit satisfactory die shear strength and connection reliability. From the viewpoint of further obtaining the above-described effect, in the flake-shaped micro copper particles, an aspect ratio may be 4 or greater, or 6 or greater.

In the micro copper particles, there is no particular limitation as to whether or not to perform a treatment with the surface treatment agent. From the viewpoints of dispersion stability and oxidation resistance, the micro copper particles may be treated with the surface treatment agent. The surface treatment agent may be removed during joining. Example of the surface treatment agent include aliphatic carboxylic acids such as palmitic acid, stearic acid, arachidic acid, and oleic acid; aromatic carboxylic acids such as terephthalic acid, pyromellitic acid, and o-phenoxybenzoic acid; aliphatic alcohols such as cetyl alcohol, stearyl alcohol, isobornyl cyclohexanol, tetraethylene glycol; aromatic alcohols such as p-phenyl phenol; alkylamines such as octylamine, dodecylamine, and stearylamine; alphatic nitriles such as stearonitrile and decanitrile; silane coupling agents such as alkylalkoxysilane; polymer treatment agents such as polyethylene glycol, polyvinyl alcohol, polyvinyl pyrrolidone, and silicone oligomer; and the like. The surface treatment agents may be used alone or in combination of two or more kinds thereof.

The treatment amount of the surface treatment agent may be set to an amount corresponding to one molecular layer or more on a particle surface. The treatment amount of the surface treatment agent varies due to a specific surface area of the micro copper particles, the molecular weight of the surface treatment agent, and a minimum covering area of the surface treatment agent. The treatment amount of the surface treatment agent is typically 0.001% by mass or greater. The specific surface area of the micro copper particles, the molecular weight of the surface treatment agent, and the minimum covering area of the surface treatment agent can be calculated by the above-described methods.

In the case of preparing the copper paste for joining with the sub-micro copper particles alone, volume shrinkage and sintering shrinkage along with drying of the dispersion medium are great, and thus the copper paste for joining is likely to be peeled off from a joining surface during sintering of the copper paste for joining, and thus it is difficult to obtain sufficient die shear strength and connection reliability in joining of a semiconductor element and the like. When the sub-micro copper particles and the micro copper particles are used in combination, volume shrinkage when sintering the copper paste for joining is suppressed, and thus a joined body can have sufficient joining strength. In the case of using the copper paste for joining in joining of a semiconductor element, a semiconductor device has an effect of exhibiting satisfactory die shear strength and connection reliability.

As the micro copper particles according to this embodiment, commercially available micro copper particles can be used. Examples of the commercially available micro particles include MA-C025 (manufactured by MITSUI MINING & SMELTING CO., LTD., volume-average particle size: 7.5 µm), 3L3 (manufactured by FUKUDA METAL FOIL & POWDER CO., LTD., volume-average particle size: 8.0 µm), 1110F (manufactured by MITSUI MINING & SMELTING CO., LTD., volume-average particle size: 3.8 µm), and Cu-HWQ 3.0 µm (manufactured by FUKUDA METAL FOIL & POWDER CO., LTD., volume-average particle size: 3.0 µm)

(Other Metal Particles Other than Copper Particles)

As the metal particles, other metal particles other than the sub-micro copper particles and the micro copper particles may be included. For example, particles of nickel, silver, gold, palladium, platinum, and the like may be included. The other metal particles may have a volume-average particle size of 0.01 µm to 10 µm, 0.01 µm to 5 µm, or 0.05 µm to 3 µm. In a case where the other metal particles are included, the amount of the metal particles contained may be less than 20% by mass, or 10% by mass or less on the basis of the total mass of the metal particles from the viewpoint of obtaining sufficient joining properties. The other metal particles may not be included. A shape of the other metal particles is not particularly limited.

When the other metal particles other than the copper particles are included, it is possible to obtain a sintered body in which a plurality of kinds of metals are solid-solved or dispersed, and thus mechanical characteristics such as a yield stress and fatigue strength of the sintered body are improved, and thus connection reliability is likely to be improved. In addition, the plurality of kinds of metal particles are added, a sintered body of the copper paste for joining can have sufficient joining strength with respect to a specific adherend. In the case of using the copper paste for joining in joining of a semiconductor element, die shear strength and connection reliability of a semiconductor device are likely to be improved.

(Dispersion Medium)

The dispersion medium is not particularly limited, and a volatile dispersion medium is also possible. Examples of the volatile dispersion medium include monohydric or polyhydric alcohols such as pentanol, hexanol, heptanol, octanol, decanol, ethylene glycol, diethylene glycol, propylene glycol, butylene glycol, α-terpineol, and isobornyl cyclohexanol (MTPH); ethers such as ethylene glycol butyl ether, ethylene glycol phenyl ether, diethylene glycol methyl ether, diethylene glycol ethyl ether, diethylene glycol butyl ether, diethylene glycol isobutyl ether, diethylene glycol hexyl ether, triethylene glycol methyl ether, diethylene glycol dimethyl ether, diethylene glycol diethyl ether, diethylene glycol dibutyl ether, diethylene glycol butyl methyl ether, diethylene glycol isopropyl methyl ether, triethylene glycol dimethyl ether, triethylene glycol butyl methyl ether, propylene glycol propyl ether, dipropylene glycol methyl ether, dipropylene glycol ethyl ether, dipropylene glycol propyl ether, dipropylene glycol butyl ether, dipropylene glycol dimethyl ether, tripropylene glycol methyl ether, and tripropylene glycol dimethyl ether; esters such as ethylene glycol ethyl ether acetate, ethylene glycol butyl ether acetate, diethylene glycol ethyl ether acetate, diethylene glycol butyl ether acetate, dipropylene glycol methyl ether acetate (DPMA), ethyl lactate, butyl lactate, γ-butyrolactone, and propylene carbonate; acid amids such as N-methyl-2-pyrrolidone, N,N-dimethylacetamide, and N,N-dimethylformamide; aliphatic hydrocarbon such as cyclohexanone, octane, nonane, decane, and undecane; aromatic hydrocarbon such as benzene, toluene, and xylene; mercaptans having an alkyl group having 1 to 18 carbon atoms; and mercaptans having a cycloalkyl group having 5 to 7 carbon atoms. Examples of the mercaptans having an alkyl group having 1 to 18 carbon atoms include ethyl mercaptan, n-propyl mercaptan, i-propyl mercaptan, n-butyl mercaptan, i-butyl mercaptan, t-butyl mercaptan, pentyl mercaptan, hexyl mercaptan, and dodecyl mercaptan. Examples of the mercaptans having a cycloalkyl group having 5 to 7 carbon atoms include cyclopentyl mercaptan, cyclohexyl mercaptan, and cycloheptyl mercaptan.

The amount of the dispersion medium contained may be 5 to 50 parts by mass when the total mass of the metal particles is set to 100 parts by mass. When the amount of the dispersion medium contained is within the above-described range, it is possible to adjust the copper paste for joining to have appropriate viscosity, and sintering of the copper paste for joining is less likely to be obstructed.

(Additive)

A wetting improving agent such as a non-ionic surfactant and a fluorine-based surfactant; a defoaming agent such as silicone oil; an ion trapping agent such as an inorganic ion exchanger; and the like may be appropriately added to the copper paste for joining as necessary.

As one aspect of the copper paste for joining of this embodiment, the following copper paste for joining can be exemplified. In the copper paste for joining, the metal particles include sub-micro copper particles having a volume-average particle size of 0.12 µm to 0.8 µm, and preferably 0.15 µm to 0.8 µm, and micro copper particles having a volume-average particle size of 2 µm to 50 µm, the sum of the amount of the sub-micro copper particles contained and the amount of the micro copper particles contained is 80% by mass or greater on the basis of the total mass of the metal particles, and the amount of the sub-micro copper particles contained is 30% by mass to 90% by mass on the basis of the sum of a mass of the sub-micro copper particles and a mass of the micro copper particles.

As the copper paste for joining, the following copper paste for joining can be exemplified. The copper paste for joining is obtained by blending sub-micro copper particles having a volume-average particle size of 0.12 µm to 0.8 µm, and preferably 0.15 µm to 0.8 µm, micro copper particles having a volume-average particle size of 2 µm to 50 µm, a dispersion medium, and the other components that is added as necessary. In the copper paste for joining, the sum of the amount of the sub-micro copper particles blended and the micro copper particles blended is 80% by mass or greater on the basis of the total mass of the metal particles, and the amount of the sub-micro copper particles blended is 30% by mass to 90% by mass on the basis of the sum of the amount of the sub-micro copper particles blended and the amount of the micro copper particles blended.

In addition, as another aspect of the copper paste for joining of this embodiment, the following copper paste for joining can be exemplified. That is, the copper paste for joining contains 24% by mass to 80% by mass of copper particles having a particle size of 0.12 µm to 0.8 µm, and preferably 0.15 µm to 0.8 µm as the sub-micro copper particles on the basis of the total mass of the metal particles, and 8% by mass to 70% by mass of micro copper particles having a particle size of 2 µm to 50 µm as the micro copper particles on the basis of the total mass of the metal particles, and the amount of the sub-micro copper particles contained is 30% by mass to 90% by mass on the basis of the sum of the mass of the sub-micro copper particles and the mass of the micro copper particles. Here, the particle size represents a maximum particle size, and is obtained by a method in which copper particles which become a raw material or dry copper particle obtained by removing a volatile component from the copper paste for joining are observed with a scanning electron microscope (SEM).

In a case where the copper particles do not have a spherical shape, a particle size thereof is set to a maximum particle size obtained by the following method. A method of calculating the maximum particle size of the copper particles from an SEM image will be described. A powder of the copper particles is placed on a carbon tape for SEM by using a spatula, and is set as a sample for SEM. The sample for SEM is observed by a SEM apparatus at a magnification of 5000 times. A rectangle that is circumscribed to a copper particle on the SEM image is drawn by using image processing software, and a long side of the rectangle is set as a major axis of the particle. The major axis is set as the maximum particle size.

(Preparation of Copper Paste for Joining)

The copper paste for joining can be prepared by mixing the sub-micro copper particles, the micro copper particles, the other metal particles, and an arbitrary additive to the dispersion medium. After mixing of the respective components, a stirring process may be performed. In the copper paste for joining, a maximum particle size of a dispersed solution may be adjusted by a classification operation. At this time, the maximum particle size of the dispersed solution may be set to 20 μm or less, or 10 μm or less.

The copper paste for joining may be prepared as follows. Specifically, the sub-micro copper particles, the surface treatment agent, and the dispersion medium are mixed with each other in advance, and a dispersing treatment is performed to prepare a dispersed solution of the sub-micro copper particles. Then, the micro copper particles, the other metal particles, and an arbitrary additive are added to the dispersed solution. According to this procedure, dispersibility of the sub-micro copper particles is improved, and mixability with the micro copper particles is enhanced, and thus the performance of the copper paste for joining is further improved. The dispersed solution of the sub-micro copper particles may be subjected to a classification operation to remove an aggregate.

The stirring processing may be performed by using a stirrer. Examples of the stirrer include a rotation and revolution type stirrer, a Raikai mixer, a biaxial kneader, a three-roll mill, a planetary mixer, and a thin layer shear disperser.

For example, the classification operation can be performed by using filtration, spontaneous sedimentation, and centrifugal separation. Examples of a filter for filtration include a metal mesh, a metal filter, and a nylon mesh.

Examples of the dispersion process include a thin layer shear disperser, a bead mill, an ultrasonic homogenizer, a high shear mixer, a narrow gap three-roll mill, a wet type ultra-atomization apparatus, a supersonic jet mill, and an ultrahigh pressure homogenizer.

When being shaped, the copper paste for joining may be adjusted to viscosity appropriate for a printing and application method. As the viscosity of the copper paste for joining, for example, Casson viscosity at 25° C. may be 0.05 Pa·s to 2.0 Pa·s, or 0.06 Pa·s to 1.0 Pa·s.

According to the copper paste for joining of this embodiment, the sub-micro copper particles and the micro copper particles are used in combination at a predetermined ratio, and thus it is possible to obtain satisfactory sinterability, and it is possible to suppress volume shrinkage during sintering. According to this, the copper paste for joining of this embodiment can secure a joining force with a member without excessive pressurization, and a joined body that is manufactured by sintering the copper paste for joining can have sufficient joining strength. In the case of using the copper paste for joining in joining of a semiconductor element, a semiconductor device exhibits satisfactory die shear strength and connection reliability. That is, the copper paste for joining of this embodiment can be used as a joining material for joining without pressurization. In addition, according to the copper paste for joining of this embodiment, relatively cheaper copper particles are used, and thus it is possible to suppress the manufacturing cost, and mass production is possible. Particularly, in the copper paste for joining of this embodiment, the above-described effect can be obtained due to the sub-micro copper particles and the micro copper particles, and thus the copper paste for joining has an advantage capable of being more cheaply and more stably supplied in comparison to a joining material including expensive copper nano particles as a main component. According to this, for example, in the case of manufacturing a joined body such as a semiconductor device, it is possible to further enhance production stability.

<Joined Body and Semiconductor Device>

Hereinafter, a preferred embodiment will be described in detail with reference to the accompanying drawings. Furthermore, in the drawings, the same reference numeral will be given to the same or equivalent portions, and redundant description thereof will be omitted. In addition, dimension ratios in the drawing are not limited to ratios illustrated in the drawings.

FIG. 1 is a schematic cross-sectional view illustrating an example of a joined body that is manufactured by using the copper paste for joining of this embodiment. A joined body 100 of this embodiment includes a first member 2, a second member 3, and a sintered body 1 of the copper paste for joining which joins the first member and the second member.

Examples of the first member 2 and the second member 3 include semiconductor elements such as an IGBT, a diode, a Schottky barrier diode, a MOS-FET, a thyristor, a logic, a sensor, an analog integrated circuit, an LED, a semiconductor laser, and a transmitter, a base material for semiconductor element mounting such as a lead frame, a metal plate-attached ceramic substrate (for example, DBC), and an LED package, a metal interconnection such as a copper ribbon and a metal plate, a block body such as a metal block, a power supply member such as a terminal, a heat dissipation plate, a water cooling plate, and the like.

The first member 2 and the second member 3 may include a metal on surfaces 4a and 4b which are in contact with a sintered body of the copper paste for joining. Examples of the metal include copper, nickel, silver, gold, palladium, platinum, lead, tin, cobalt, and the like. The metals may be used alone or in combination of two or more kinds thereof. In addition, the surfaces which are in contact with the sintered body may an alloy including the metals. Examples of metals which can be used in the alloy include zinc, manganese, aluminum, beryllium, titanium, chromium, iron, molybdenum, and the like in addition to the above-described metals. Examples of a member including a metal on a surface that is in contact with the sintered body include a member including various kinds of metal plating, a wire, a chip including metal plating, a heat spreader, a metal plate-attached ceramic substrate, a lead frame including various kinds of metal plating or a lead frame constituted by various kinds of metals, a copper plate, and copper foil. In addition, in a case where the second member 3 is a semiconductor element, the first member 2 may be a metal interconnection such as a metal frame, a block body such as a metal block having thermal conductivity and electric conductivity, and the like.

The die shear strength of the joined body may be 10 MPa or greater, 15 MPa or greater, 20 MPa or greater, or 30 MPa or greater from the viewpoint of sufficiently joining the first member and the second member to each other. The die shear strength can be measured by using a full-universal type bond tester (4000 series, manufactured by DAGE corporation), and the like.

A thermal conductivity of a sintered body of the copper paste for joining may be 100 W/(m·k) or greater, 120 W/(m·k) or greater, or 150 W/(m·k) or greater from the viewpoints of heat dissipation and connection reliability at a high temperature. The thermal conductivity can be calculated from thermal diffusivity, specific heat capacity, and a density of the sintered body of the copper paste for joining.

Hereinafter, description will be given of a method for manufacturing a joined body that uses the copper paste for joining of this embodiment.

The method for manufacturing the joined body that uses the copper paste for joining of this embodiment includes a process of preparing a laminated body in which a first member, and the copper paste for joining and a second member, which are disposed on a side on which own weight of the first member acts, are laminated in this order, and sintering the copper paste for joining in a state of receiving the own weight of the first member, or the own weight of the first member and a pressure of 0.01 MPa or lower. The direction in which the own weight of the first member acts represents a direction in which the gravity acts.

For example, the laminated body can be prepared by providing the copper paste for joining of this embodiment at a necessary portion of the second member and by disposing the first member on the copper paste for joining.

A method for providing the copper paste for joining of this embodiment at the necessary portion of the second member may be a method in which the copper paste for joining is deposited. As the method, for example, screen printing, transfer printing, offset printing, a jet printing method, a dispenser, a jet dispenser, a needle dispenser, a comma coater, a slit coater, a die coater, a gravure coater, slit coat, relief printing, intaglio printing, gravure printing, stencil printing, soft lithography, bar coat, an applicator, a particle deposition method, a spray coater, a spin coater, a dipping coater, electrodeposition coating, and the like can be used. The thickness of the copper paste for joining may 1 μm to 1000 μm, 10 μm to 500 μm, 50 μm to 200 μm, 10 μm to 3000 μm, 15 μm to 500 μm, 20 μm to 300 μm, 5 μm to 500 μm, 10 μm to 250 μm, or 15 μm 150 μm.

The copper paste for joining that is provided on the second member may be appropriately dried from the viewpoint of suppressing occurrence of flowing and voids during sintering. A gas atmosphere during drying may be set to the atmosphere, an oxygen-free atmosphere such as nitrogen and an inert gas, or a reducing atmosphere such as hydrogen and formic acid. A drying method may be drying through being left at room temperature, drying under heating, drying under a reduced pressure. In the drying under heating or the drying under a reduced pressure, for example, a hot plate, a hot wind drier, a hot wind heating furnace, a nitrogen drier, an infrared drier, an infrared heating furnace, a far infrared heating furnace, a microwave heating apparatus, a laser heating apparatus, an electromagnetic heating apparatus, a heater heating apparatus, a vapor heating furnace, a hot-plate press apparatus, and the like can be used. A drying temperature and a drying time may be appropriately adjusted in accordance with the kind and the amount of the dispersion medium that is used. With regard to the drying temperature and the drying time, for example, drying may be performed at a temperature of 50° C. to 180° C. for 1 minute to 120 minutes.

With regard to a method for disposing the first member on the copper paste for joining, for example, a chip mounter, a flip chip bonder, a positioning jig formed from carbon or ceramic can be exemplified.

The laminated body is heated to sinter the copper paste for joining. With regard to the heating treatment, for example, a hot plate, a hot wind drier, a hot wind heating furnace, a nitrogen drier, an infrared drier, an infrared heating furnace, a far infrared heating furnace, a microwave heating apparatus, a laser heating apparatus, an electromagnetic heating apparatus, a heater heating apparatus, a vapor heating furnace, and the like can be used.

A gas atmosphere during sintering may be an oxygen-free atmosphere from the viewpoint of suppressing oxidation of the sintered body, the first member, and the second member. The gas atmosphere during sintering may be a reducing atmosphere from the viewpoint of removing a surface oxide of copper particles of the copper paste for joining. With regard to the oxygen-free atmosphere, introduction of an oxygen-free gas such as nitrogen and an inert gas, or a vacuum state can be exemplified. Examples of the reducing atmosphere include atmospheres in a pure hydrogen gas, in a mixed gas of hydrogen and nitrogen which are represented by a foaming gas, in nitrogen including a formic acid gas, in a mixed gas of hydrogen and an inert gas, in an inert gas including a formic acid gas, and the like.

The highest temperature reached in the heating treatment may 250° C. to 450° C., 250° C. to 400° C., or 250° C. to 350° C. from the viewpoints of reducing thermal damage to the first member and the second member and of improving a yield ratio. When the highest temperature reached is 200° C. or higher, if a retention time of the highest temperature reached is 60 minutes or shorter, sintering tends to be sufficiently progressed.

The retention time of the highest temperature reached may be 1 minute to 60 minutes, equal to or longer than 1 minute and shorter than 40 minutes, or equal to or longer than 1 minute and shorter than 30 minutes from the viewpoints of vaporizing the entirety of the dispersion medium and of improving a yield ratio.

When using the copper paste for joining of this embodiment, even in the case of performing joining without pressurization when sintering the laminated body, the joined body can have sufficient joining strength. That is, it is possible to obtain sufficient joining strength in a state of receiving the own weight of the first member laminated on the copper paste for joining, or in a state of receiving the own weight of the first member and a pressure of 0.01 MPa or less, and preferably 0.005 MPa or less. When the pressure received during sintering is within the above-described range, a particular pressurizing apparatus is not necessary. Accordingly, a yield ratio does not deteriorate, and it is possible to further reduce voids and it is possible to further improve die shear strength and connection reliability. As a method in which the copper paste for joining receives a pressure of 0.01 MPa or less, for example, a method in which a weight is placed on the first member can be exemplified.

In the joined body, at least one of the first member and the second member may be a semiconductor element. Examples of the semiconductor element include power modules including a diode, a rectifier, a thyristor, a MOS gate driver, a power switch, a power MOSFET, an IGBT, a Schottky diode, a fast recovery diode, and the like, a transmitter, an amplifier, an LED module, and the like. In this case, the joined body becomes a semiconductor device. The semiconductor device obtained can have sufficient die shear strength and connection reliability.

Figure 2:
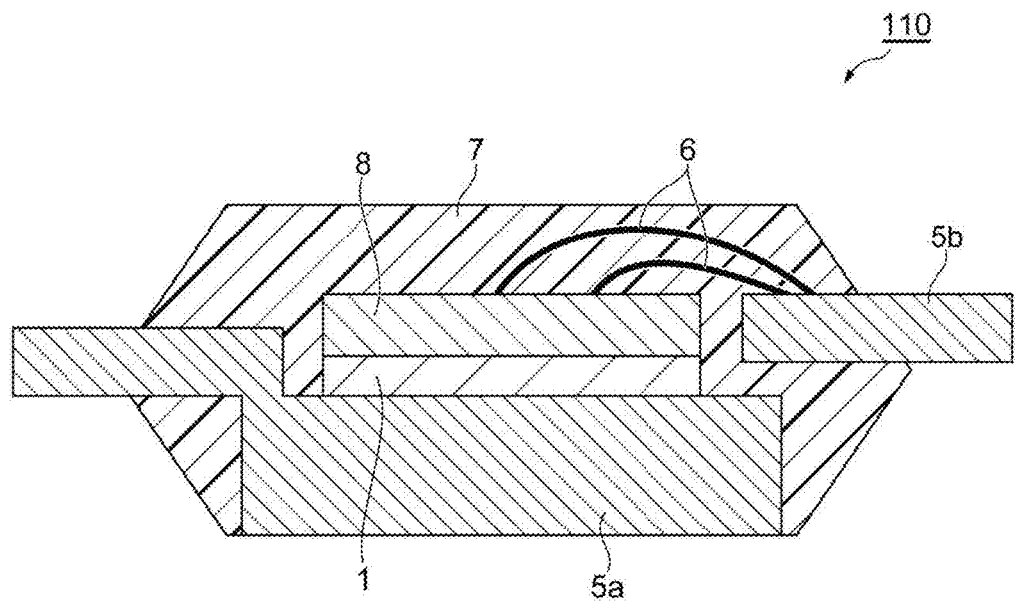
FIG. 2 is a schematic cross-sectional view illustrating an example of a semiconductor device that is manufactured by using the copper paste for joining according to this embodiment.

FIG. 2 is a schematic cross-sectional view illustrating an example of a semiconductor device that is manufactured by using the copper paste for joining of this embodiment. A semiconductor device 110 illustrated in FIG. 2 includes a semiconductor element 8 that is connected onto a lead frame 5a through the sintered body 1 of the copper paste for joining according to this embodiment, and a mold resin 7 that molds the resultant laminated body. The semiconductor element 8 is connected to a lead frame 5b through a wire 6.

Examples of a semiconductor device that is manufactured by using the copper paste for joining of this embodiment include power modules including a diode, a rectifier, a thyristor, a MOS gate driver, a power switch, a power MOSFET, an IGBT, a Schottky diode, a fast recovery diode and the like, a transmitter, an amplifier, a high-brightness LED module, a sensor, and the like.

The semiconductor device can be manufactured in the same manner as in the method for manufacturing the joined body described above. That is, the method for manufacturing the semiconductor device includes a process of preparing a laminated body in which a semiconductor element is used as at least one of the first member and the second member, and the first member, and the copper paste for joining and the second member, which are disposed on a side on which the own weight of the first member acts, are laminated in this order, and of sintering the copper paste for joining in a state of receiving the own weight of the first member, or the own weight of the first member and a pressure of 0.01 MPa or lower. For example, a process of providing the copper paste for joining on the lead frame 5a, disposing the semiconductor element 8 thereon, and heating the resultant laminated body can be exemplified. A semiconductor device that is obtained can have sufficient die shear strength and connection reliability even in the case of performing joining without pressurization. The semiconductor device of this embodiment includes a copper sintered body having a sufficient joining force and high thermal conductivity and melting point, and thus the semiconductor device has sufficient die shear strength, and is excellent in connection reliability and power cycle resistance.

According to the method, in a case where the second member is a semiconductor element, it is possible to reduce damage to the semiconductor element when joining a metal interconnection, a block body, and the like as the first member to the semiconductor element. A semiconductor device in which a member such as the metal interconnection, the block body, or the like is joined onto the semiconductor element will be described below.

As an embodiment of the semiconductor device, the following semiconductor device can be exemplified. Specifically, the semiconductor device includes a first electrode, a semiconductor element that is electrically connected to the first electrode, and a second electrode that is electrically connected to the semiconductor element through a metal interconnection. A sintered body of the copper paste for joining is provided between the semiconductor element and the metal interconnection, and between the metal interconnection and the second electrode.

Figure 3:
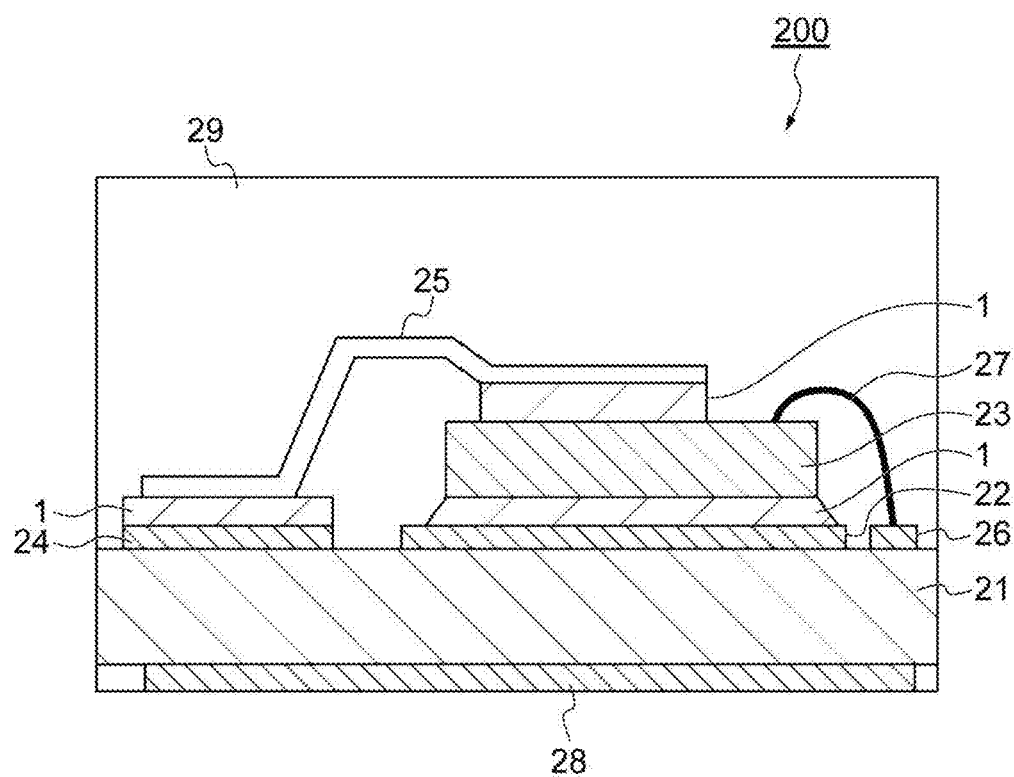
FIG. 3 is a schematic cross-sectional view illustrating an example of the semiconductor device that is manufactured by using the copper paste for joining according to this embodiment.

FIG. 3 is a schematic cross-sectional view illustrating an example of the semiconductor device. A semiconductor device 200 illustrated in FIG. 3 includes an insulating substrate 21 provided with a first electrode 22 and a second electrode 24, a semiconductor element 23 that is joined onto the first electrode 22 by the sintered body 1 of the copper paste for joining, and a metal interconnection 25 that electrically connects the semiconductor element 23 and the second electrode 24. Between the metal interconnection 25 and the semiconductor element 23, and between the metal interconnection 25 and the second electrode 24 are respectively joined to each other by the sintered body 1 of the copper paste for joining. In addition, the semiconductor element 23 is connected to a third electrode 26 through a wire 27. The semiconductor device 200 is provided with a copper plate 28 on a side, which is opposite to a surface on which the electrodes and the like are mounted, of the insulating substrate 21. In the semiconductor device 200, the structure body is sealed with an insulator 29. The semiconductor device 200 includes one piece of the semiconductor element 23 on the first electrode 22, but two or more pieces of the semiconductor elements 23 may be provided. In this case, a plurality of the semiconductor elements 23 can be respectively joined to the metal interconnection 25 by the sintered body 1 of the copper paste for joining.

Figure 4:
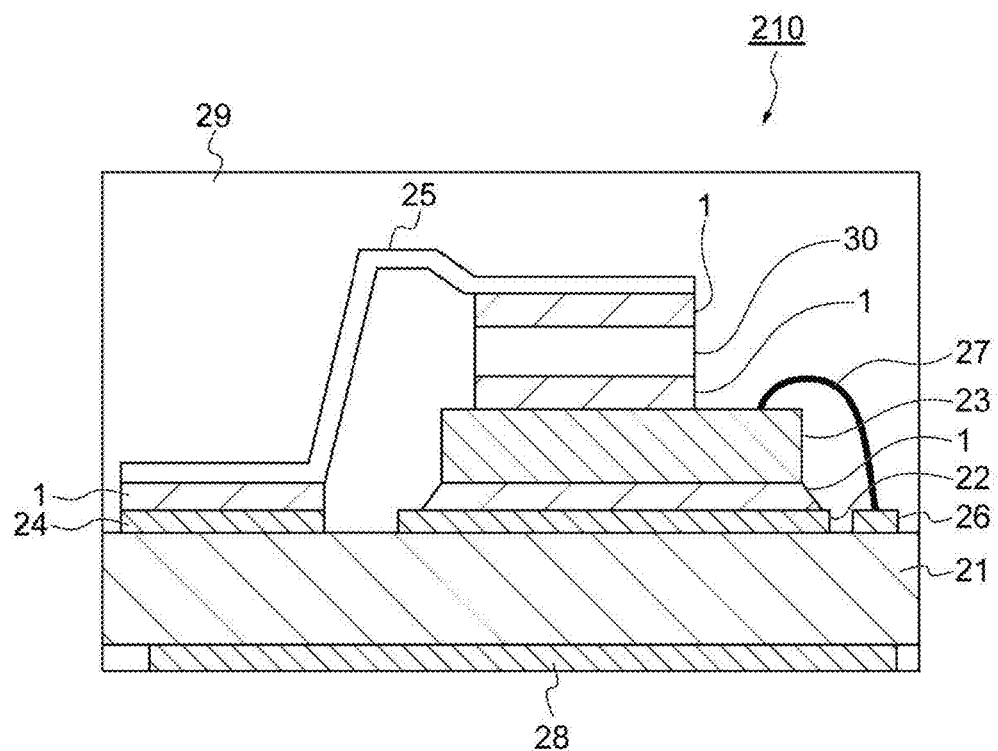
FIG. 4 is a schematic cross-sectional view illustrating an example of the semiconductor device that is manufactured by using the copper paste for joining according to this embodiment.

FIG. 4 is a schematic cross-sectional view illustrating another example of the semiconductor device. A semiconductor device 210 illustrated in FIG. 4 has the same configuration as in the semiconductor device 200 illustrated in FIG. 3 except that a block body 30 is provided between the semiconductor element 23 and the metal interconnection 25, and between the semiconductor element 23 and the block body 30, and between the block body 30 and the metal interconnection 25 are respectively joined by the sintered body 1 of the copper paste for joining. Furthermore, a position of the block body 30 can be appropriately changed, and may be provided between the first electrode 22 and the semiconductor element 23 as an example.

Figure 5:
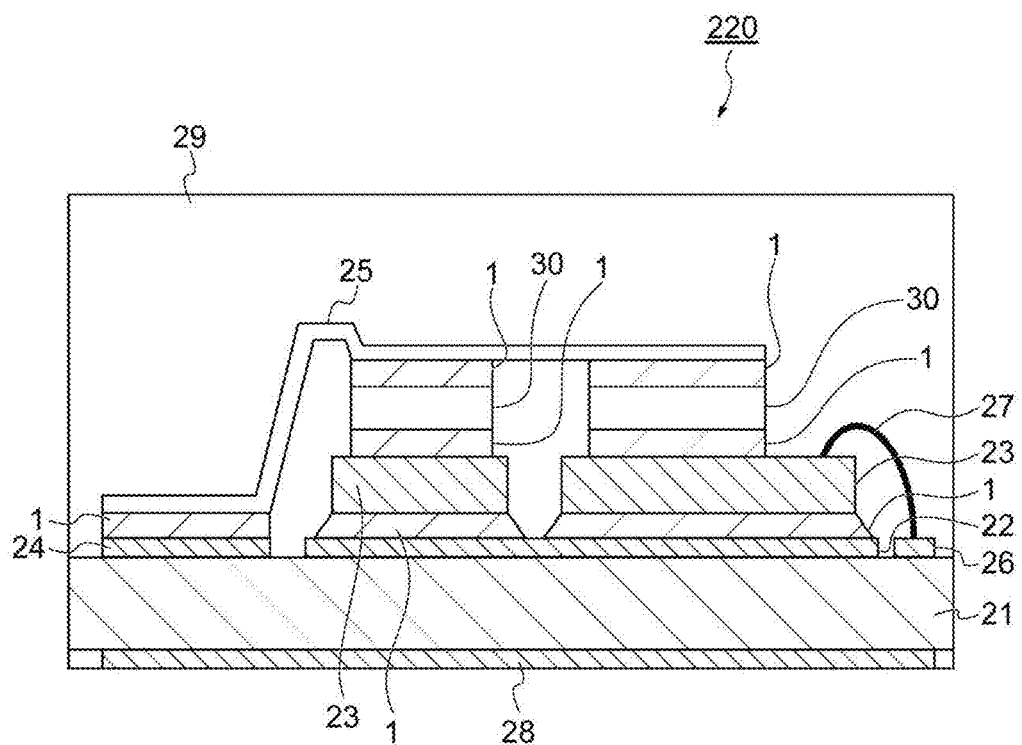
FIG. 5 is a schematic cross-sectional view illustrating an example of the semiconductor device that is manufactured by using the copper paste for joining according to this embodiment.

FIG. 5 is a schematic cross-sectional view illustrating still another example of the semiconductor device. A semiconductor device 220 illustrated in FIG. 5 has the same configuration as in the semiconductor device 210 illustrated in FIG. 4 except that the sintered body 1 of the copper paste for joining, which is parallel to the semiconductor element 23 and the block body 30, is further provided over the first electrode 22 to respectively join the first electrode 22, the semiconductor element 23, and the block body 30. The semiconductor device 220 includes two pieces of the semiconductor elements on the first electrode 22, but three or more pieces of the semiconductor elements may be provided. Even in this case, the three or more semiconductor elements 23 can be respectively joined to the metal interconnection 25 by the sintered body 1 of the copper paste for joining through the block body 30. Furthermore, a position of the block body 30 can be appropriately changed, and may be provided between the first electrode 22 and the semiconductor element 23 as an example.

Examples of the insulating substrate 21 include ceramic such as alumina, aluminum nitride, and silicon nitride, a highly thermal conductive particle/resin composite, a polyimide resin, a polymaleimide resin, and the like.

Examples of the metal that constitutes the first electrode 22, the second electrode 24, and the third electrode 26 include copper, nickel, silver, gold, palladium, platinum, lead, tin, cobalt, and the like. The metals can be used alone or in combination of two or more kinds thereof. In addition, the electrodes may include an alloy, which contains the metals, on a surface that is in contact with the sintered body 1 of the copper paste for joining. Examples of the metal that can be used in the alloy include zinc, manganese, aluminum, beryllium, titanium, chromium, iron, molybdenum, and the like other than the above-described metals.

Examples of the metal interconnection include a metal frame having a shape such as a strip shape, a plate shape, a cubic shape, a cylindrical shape, an L-shape, and a ⊃-shape, and a Λ-shape, and the like. Examples of a material of the metal interconnection include silver, copper, iron, aluminum, molybdenum, tungsten, tantalum, niobium, or an alloy thereof. In addition, the metal interconnection may have a width of 1 μm to 30 μm, and a thickness of 20 μm to 5 mm.

It is preferable that the block body has excellent thermal conductivity and electric conductivity, and for example, silver, copper, iron, aluminum, molybdenum, tungsten, tantalum, niobium, or an alloy thereof can be used as the block body. When the block body is provided on the semiconductor element, heat dissipation is further improved. The number of the block body can be appropriately changed.

Examples of the insulator 29 include a silicone gel, a polymaleimide resin, a polyimide resin, a polyamideimide resin, and the like.

The semiconductor devices illustrated in FIGS. 3 to 5 can be used in a power module that is required to have high reliability at large capacity.

For example, the semiconductor device illustrated in FIGS. 3 to 5 can be manufactured by a method including a process of preparing an insulating substrate provided with a first electrode and a second electrode, providing copper paste for joining and a semiconductor element, and as necessary, copper paste for joining, a block body, and copper paste for joining on the first electrode in this order from the first electrode side, providing copper paste for joining on the second electrode, and disposing a metal interconnection on the copper paste for joining on the semiconductor element or the block body and on the copper paste for joining on the second electrode for crosslinkage of the copper paste for joining, and a process of sintering the copper paste for joining in a state of receiving own weight of the respective members, or the own weight of the respective members and a pressure of 0.01 MPa or less.

According to the manufacturing method, it is possible to manufacture a semiconductor device without pressurization. Accordingly, it is possible to perform joining without deforming the metal interconnection having a bridge portion, and it is possible to reduce damage for a semiconductor element even in the case of joining a member having an area smaller than that of the semiconductor element onto the semiconductor element.

Figure 6:
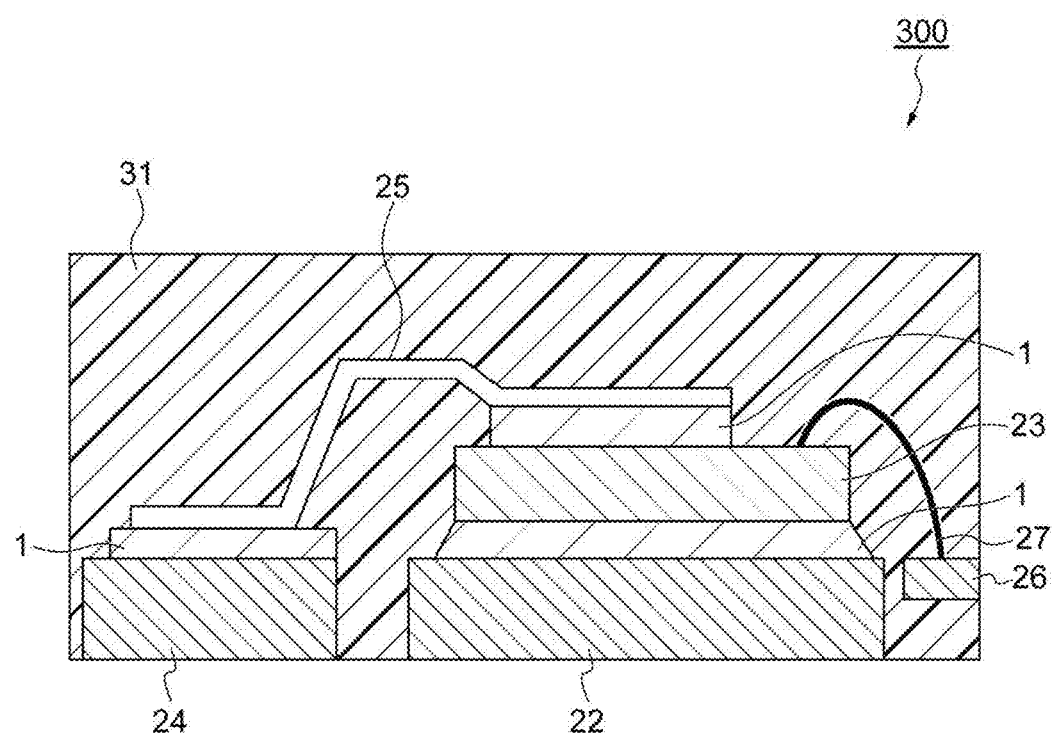
FIG. 6 is a schematic cross-sectional view illustrating an example of the semiconductor device that is manufactured by using the copper paste for joining according to this embodiment.

FIG. 6 is a schematic cross-sectional view illustrating still another example of the semiconductor device. A semiconductor device 300 illustrated in FIG. 6 includes a first electrode 22, a semiconductor element 23 that is joined onto the first electrode 22 by the sintered body 1 of the copper paste for joining, and a metal interconnection 25 that electrically connects the semiconductor element 23 and a second electrode 24. Between the metal interconnection 25 and the semiconductor element 23, and between the metal interconnection 25 and the second electrode 24 are joined by the sintered body 1 of the copper paste for joining. In addition, the semiconductor element 23 is connected to the third electrode 26 through a wire 27. In the semiconductor device 300, the above-described structure body is sealed with a sealing material 31. The semiconductor device 300 includes one piece of the semiconductor element 23 on the first electrode 22, but two or more pieces of the semiconductor elements 23 may be provided. In this case, a plurality of the semiconductor elements 23 can be respectively joined to the metal interconnection 25 by the sintered body 1 of the copper paste for joining.

Figure 7:
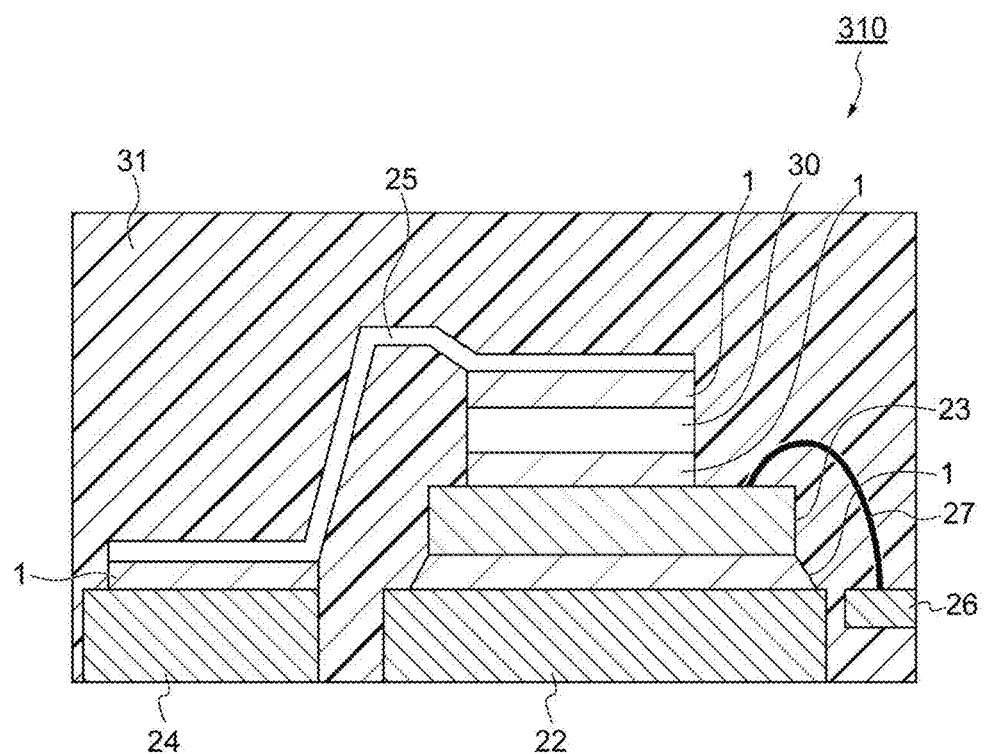
FIG. 7 is a schematic cross-sectional view illustrating an example of the semiconductor device that is manufactured by using the copper paste for joining according to this embodiment.

FIG. 7 is a schematic cross-sectional view illustrating still another example of the semiconductor device. A semiconductor device 310 illustrated in FIG. 7 has the same configuration as in the semiconductor device 300 illustrated in FIG. 6 except that a block body 30 is provided between the semiconductor element 23 and the metal interconnection 25, and between the semiconductor element 23 and the block body 30, and between the block body 30 and the metal interconnection 25 are respectively joined by the sintered body 1 of the copper paste for joining. Furthermore, a position of the block body 30 can be appropriately changed, and may be provided between the first electrode 22 and the semiconductor element 23 as an example.

Figure 8:
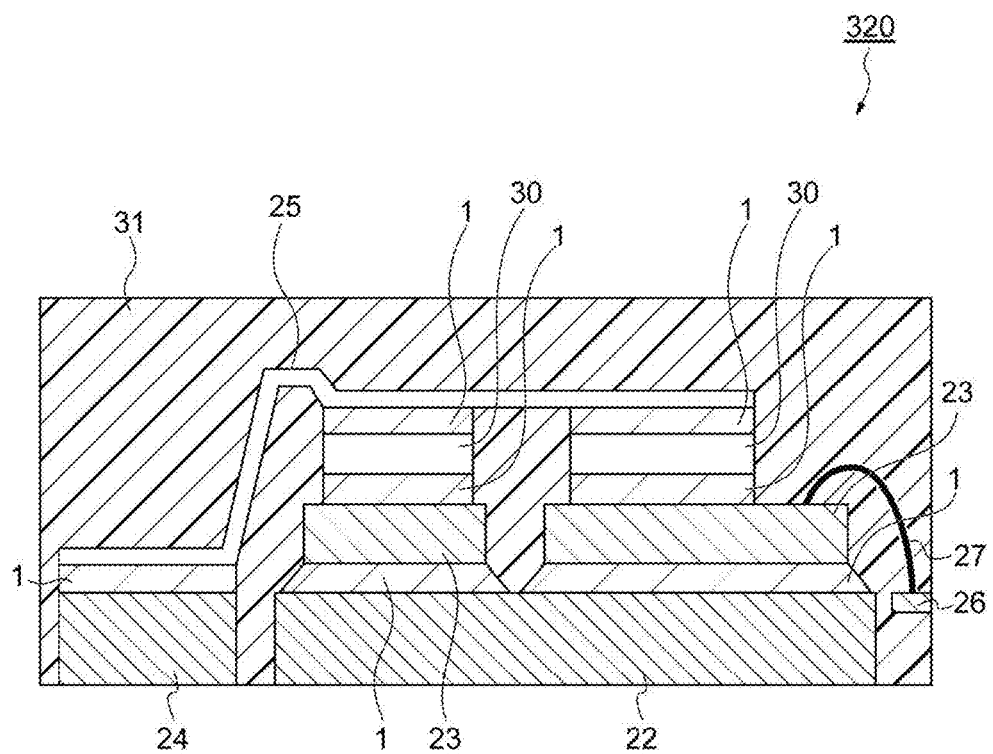
FIG. 8 is a schematic cross-sectional view illustrating an example of the semiconductor device that is manufactured by using the copper paste for joining according to this embodiment.

FIG. 8 is a schematic cross-sectional view illustrating still another example of the semiconductor device. A semiconductor device 320 illustrated in FIG. 8 has the same configuration as in the semiconductor device 310 illustrated in FIG. 7 except that the sintered body 1 of the copper paste for joining, which is parallel to the semiconductor element 23 and the block body 30, is further provided over the first electrode 22 to respectively join the first electrode 22, the semiconductor element 23, and the block body 30. The semiconductor device 320 includes two pieces of the semiconductor elements on the first electrode 22, but three or more pieces of the semiconductor elements may be provided. Even in this case, the three or more semiconductor elements 23 can be respectively joined to the metal interconnection 25 by the sintered body 1 of the copper paste for joining through the block body 30. Furthermore, a position of the block body 30 can be appropriately changed, and may be provided between the first electrode 22 and the semiconductor element 23 as an example.

The first electrode 22 and the second electrode 24 which are illustrated in FIGS. 6 to 8 may be a lead frame, a copper plate, a copper and molybdenum sintered body.

Examples of the sealing material 31 include heat-resistant solid sealing material, a highly thermal conductive composite, and the like.

The sintered body 1 of the copper paste for joining can be similar to the sundered body 1 described in the semiconductor devices 200 to 220.

When employing a lead frame and the like as the first electrode and the second electrode, the semiconductor device of the embodiment in FIGS. 6 to 8 can be used in a small-sized power module. The semiconductor devices can be manufactured in the same manner as in the above-described method for manufacturing the semiconductor device.

In addition, description will be given of still another example of the semiconductor device having a structure in which a block body is joined onto a semiconductor element.

As the semiconductor device, the following semiconductor device can be exemplified. Specifically, the semiconductor device includes a first thermal conduction member, a second thermal conduction member, and a semiconductor element that is disposed between the first thermal conduction member and the second thermal conduction member. A sintered body of the copper paste for joining is provided at least one side between the first thermal conduction member and the semiconductor element, and between the semiconductor element and the second thermal conduction member.

Figure 9:
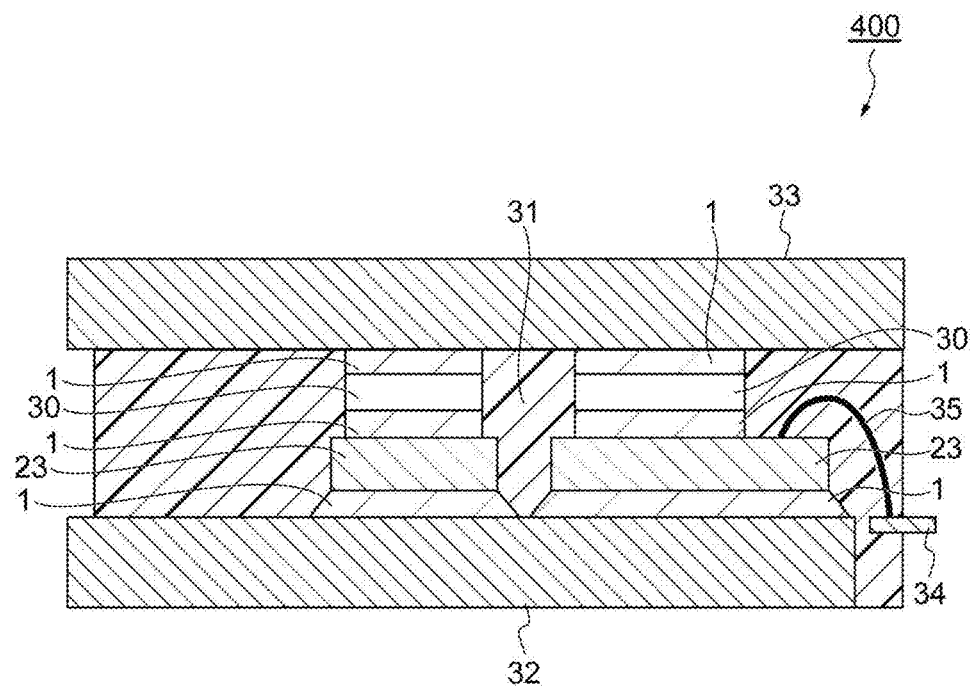
FIG. 9 is a schematic cross-sectional view illustrating an example of the semiconductor device that is manufactured by using the copper paste for joining according to this embodiment.

FIG. 9 is a schematic cross-sectional view illustrating one example of this embodiment. A semiconductor device 400 illustrated in FIG. 9 includes a first thermal conduction member 32, a semiconductor element 23 that is joined onto the first thermal conduction member 32 through the sintered body 1 of the copper paste for joining, a block body 30 that is joined onto the semiconductor element 23 through the sintered body 1 of the copper paste for joining, and a second thermal conduction member 33 that is joined onto the block body 30 through the sintered body 1 of the copper paste for joining. The semiconductor element 23 is connected to an electrode 34 through a wire 35. In the semiconductor device 400, a space between the first thermal conduction member 32 and the second thermal conduction member is sealed with a sealing material 31. The semiconductor device 400 includes two semiconductor elements. However, one or three or more semiconductor elements may be provided, and the number of the block body can be appropriately changed. Furthermore, a position of the block body 30 can be appropriately changed, and may be provided between the first electrode 22 and the semiconductor element 23 as an example.

The thermal conduction members have a function of emitting heat generated from the semiconductor element 23 to the outside, and a function as an electrode that electrically connects the semiconductor element to the outside. For example, copper, aluminum, and an alloy thereof can be used in the thermal conduction members.

The semiconductor device illustrated in FIG. 9 includes the thermal conduction member on both sides of the semiconductor element. Accordingly, the semiconductor device can have a double-sided cooling structure excellent in heat dissipation. The semiconductor device can be manufactured by a method including a process of preparing a laminated body in which copper paste for joining, a semiconductor element, copper paste for joining, a block body, copper paste for joining, and a second thermal conduction member are laminated on a first thermal conduction member in this order from the first thermal conduction member side, and sintering the copper paste for joining in a state of receiving own weight of the respective members, or the own weight of the respective members and a pressure of 0.01 MPa or less. Furthermore, in the laminated body, lamination may be performed in reverse order.

EXAMPLES

Hereinafter, the invention will be described specifically with reference to examples. However, the invention is not limited to the following examples.

Preparation Example 1

0.35 g of α-terpineol (manufactured by Wako Pure Chemical Industries, Ltd.) and 0.85 g of isobornyl cyclohexanol (MTPH, manufactured by Nippon Terpene Chemicals, Inc.) as a dispersion medium, 3.52 g of CH-0200 (surface treatment agent: lauric acid, manufactured by MITSUI MINING & SMELTING CO., LTD.) as sub-micro copper particles, and 5.28 g of MA-C025 (manufactured by MITSUI MINING & SMELTING CO., LTD.) as micro copper particles were kneaded with an agitate mortar until a dry powder disappeared, and the resultant mixed solution was put into a plastic bottle. The plastic bottle that was hermetically sealed was stirred by using a rotation and revolution type stirrer (Planetary Vacuum Mixer ARV-310, manufactured by THINKY CORPORATION) at 2000 min$^{-1}$ (2000 revolutions/minute) for 2 minutes. Then, the resultant mixed solution was processed by an ultrasonic homogenizer (US-600, manufactured by Nippon Seiki Co., Ltd.) at 19.6 kHz and 600 W for 1 minute. Then, the plastic bottle that was hermetically sealed was stirred by using the rotation and revolution type stirrer (Planetary Vacuum Mixer ARV-310, manufactured by THINKY CORPORATION) at 2000 min$^{-1}$ (2000 revolutions/minute) for 2 minutes. The resultant mixed solution was set as copper plastic for joining 1.

Preparation Example 2

0.44 g of α-terpineol (manufactured by Wako Pure Chemical Industries, Ltd.) and 0.76 g of isobornyl cyclohexanol (MTPH, manufactured by Nippon Terpene Chemicals, Inc.) as a dispersion medium, 4.40 g of CH-0200 (surface treatment agent: lauric acid, manufactured by MITSUI MINING & SMELTING CO., LTD.) as sub-micro copper particles, and 4.40 g of MA-C025 (manufactured by MITSUI MINING & SMELTING CO., LTD.) as micro copper particles were kneaded with an agitate mortar until a dry powder disappeared, and the resultant mixed solution was put into a plastic bottle. The same method as in Preparation Example 1 was performed except that this mixed solution was used, thereby preparing copper paste for joining 2.

Preparation Example 3

0.52 g of α-terpineol (manufactured by Wako Pure Chemical Industries, Ltd.) and 0.68 g of isobornyl cyclohexanol (MTPH, manufactured by Nippon Terpene Chemicals, Inc.) as a dispersion medium, 5.28 g of CH-0200 (surface treatment agent: lauric acid, manufactured by MITSUI MINING & SMELTING CO., LTD.) as sub-micro copper particles, and 3.52 g of MA-C025 (manufactured by MITSUI MINING & SMELTING CO., LTD.) as micro copper particles were kneaded with an agitate mortar until a dry powder disappeared, and the resultant mixed solution was put into a plastic bottle. The same method as in Preparation Example 1 was performed except that this mixed solution was used, thereby preparing copper paste for joining 3.

Preparation Example 4

0.61 g of α-terpineol (manufactured by Wako Pure Chemical Industries, Ltd.) and 0.59 g of isobornyl cyclohexanol (MTPH, manufactured by Nippon Terpene Chemicals, Inc.) as a dispersion medium, 6.16 g of CH-0200 (surface treatment agent: lauric acid, manufactured by MITSUI MINING & SMELTING CO., LTD.) as sub-micro copper particles, and 2.64 g of MA-C025 (manufactured by MITSUI MINING & SMELTING CO., LTD.) as micro copper particles were kneaded with an agitate mortar until a dry powder disappeared, and the resultant mixed solution was put into a plastic bottle. The same method as in Preparation Example 1 was performed except that this mixed solution was used, thereby preparing copper paste for joining 4.

Preparation Example 5

0.78 g of α-terpineol (manufactured by Wako Pure Chemical Industries, Ltd.) and 0.42 g of isobornyl cyclohexanol (MTPH, manufactured by Nippon Terpene Chemicals, Inc.) as a dispersion medium, 7.91 g of CH-0200 (surface treatment agent: lauric acid, manufactured by MITSUI MINING & SMELTING CO., LTD.) as sub-micro copper particles, and 0.88 g of MA-C025 (manufactured by MITSUI MINING & SMELTING CO., LTD.) as micro copper particles were kneaded with an agitate mortar until a dry powder disappeared, and the resultant mixed solution was put into a plastic bottle. The same method as in Preparation Example 1 was performed except that this mixed solution was used, thereby preparing copper paste for joining 5.

Preparation Example 6

0.90 g of α-terpineol (manufactured by Wako Pure Chemical Industries, Ltd.) as a dispersion medium, 6.40 g of CH-0200 (surface treatment agent: lauric acid, manufactured by MITSUI MINING & SMELTING CO., LTD.) as sub-micro copper particles, and 2.75 g of 3L3 (manufactured by FUKUDA METAL FOIL & POWDER CO., LTD.) as micro copper particles were kneaded with an agitate mortar until a dry powder disappeared, and the resultant mixed solution was put into a plastic bottle. The same method as in Preparation Example 1 was performed except that this mixed solution was used, thereby preparing copper paste for joining 6.

Preparation Example 7

0.90 g of α-terpineol (manufactured by Wako Pure Chemical Industries, Ltd.) as a dispersion medium, 4.58 g of CH-0200 (surface treatment agent: lauric acid, manufactured by MITSUI MINING & SMELTING CO., LTD.) as sub-micro copper particles, and 4.58 g of 1110F (manufactured by MITSUI MINING & SMELTING CO., LTD.) as micro copper particles were kneaded with an agitate mortar until a dry powder disappeared, and the resultant mixed solution was put into a plastic bottle. The same method as in Preparation Example 1 was performed except that this mixed solution was used, thereby preparing copper paste for joining 7.

Preparation Example 8

0.61 g of α-terpineol (manufactured by Wako Pure Chemical Industries, Ltd.) and 0.59 g of isobornyl cyclohexanol (MTPH, manufactured by Nippon Terpene Chemicals, Inc.) as a dispersion medium, 6.16 g of CH-0200 (surface treatment agent: lauric acid, manufactured by MITSUI MINING & SMELTING CO., LTD.) as sub-micro copper particles, and 2.64 g of Cu-HWQ 3.0 µm (manufactured by FUKUDA METAL FOIL & POWDER CO., LTD.) as micro copper particles were kneaded with an agitate mortar until a dry powder disappeared, and the resultant mixed solution was put into a plastic bottle. The same method as in Preparation Example 1 was performed except that this mixed solution was used, thereby preparing copper paste for joining 8.

Preparation Example 9

6.1 g of α-terpineol and 0.59 g of isobornyl cyclohexanol (MTPH, manufactured by Nippon Terpene Chemicals, Inc.) as a dispersion medium, 6.16 g of HT-14 (surface treatment agent: not contained, manufactured by MITSUI MINING & SMELTING CO., LTD.) as sub-micro copper particles, and 0.58 g of a lauric acid (manufactured by Wako Pure Chemical Industries, Ltd.) as a surface treatment agent were blended, and were mixed with an automatic mortar for 10 minutes to prepare a mixed solution. Then, the mixed solution was processed by an ultrasonic homogenizer (US-600, manufactured by Nippon Seiki Co., Ltd.) at 19.6 kHz and 600 W for 2 minutes. A paste-like composition that was obtained was allowed to pass through a nylon mesh (Bolting Cloth 355T, manufactured by AS ONE Corporation), thereby obtaining an HT-14 paste-like composition. 7.36 g of the HT-14 paste-like composition, and 2.64 g of MA-C025 (manufactured by MITSUI MINING & SMELTING CO., LTD.) as micro copper particles were kneaded with an agitate mortar until a dry powder disappeared, and the resultant mixed solution was put into a plastic bottle. The same method as in Preparation Example 1 was performed except that this mixed solution was used, thereby preparing copper paste for joining 9.

Preparation Example 10

0.94 g of α-terpineol (manufactured by Wako Pure Chemical Industries, Ltd.) and 0.26 g of isobornyl cyclohexanol (MTPH, manufactured by Nippon Terpene Chemicals, Inc.) as a dispersion medium, 2.64 g of CH-0200 (surface treatment agent: lauric acid, manufactured by MITSUI MINING & SMELTING CO., LTD.) as sub-micro copper particles, and 6.16 g of MA-C025 (manufactured by MITSUI MINING & SMELTING CO., LTD.) as micro copper particles were kneaded with an agitate mortar until a dry powder disappeared, and the resultant mixed solution was put into a plastic bottle. The same method as in Preparation Example 1 was performed except that this mixed solution was used, thereby preparing copper paste for joining 10.

Preparation Example 11

0.78 g of α-terpineol (manufactured by Wako Pure Chemical Industries, Ltd.) and 0.42 g of isobornyl cyclohexanol (MTPH, manufactured by Nippon Terpene Chemicals, Inc.) as a dispersion medium, 7.92 g of CH-0200 (surface treatment agent: lauric acid, manufactured by MITSUI MINING & SMELTING CO., LTD.) as sub-micro copper particles, and 0.88 g of MA-C025 (manufactured by MITSUI MINING & SMELTING CO., LTD.) as micro copper particles were kneaded with an agitate mortar until a dry powder disappeared, and the resultant mixed solution was put into a plastic bottle. The same method as in Preparation Example 1 was performed except that this mixed solution was used, thereby preparing copper paste for joining 11.

Preparation Example 12

1.20 g of α-terpineol (manufactured by Wako Pure Chemical Industries, Ltd.) as a dispersion medium, 7.00 g of CT-500 (surface treatment agent: unknown, manufactured by MITSUI MINING & SMELTING CO., LTD.) as sub-micro copper particles, 3.00 g of MA-C025 (manufactured by MITSUI MINING & SMELTING CO., LTD.) as micro copper particles were kneaded with an agitate mortar until a dry powder disappeared, and the resultant mixed solution was put into a plastic bottle. The same method as in Preparation Example 1 was performed except that this mixed solution was used, thereby preparing copper paste for joining 12.

Preparation Example 13

1.20 g of α-terpineol (manufactured by Wako Pure Chemical Industries, Ltd.) as a dispersion medium, and 8.80 g of MA-C025 (manufactured by MITSUI MINING & SMELTING CO., LTD.) as micro copper particles were kneaded with an agitate mortar until a dry powder disappeared, and the resultant mixed solution was put into a plastic bottle. The same method as in Preparation Example 1 was performed except that this mixed solution was used, thereby preparing copper paste for joining 13.

Preparation Example 14

0.22 g of α-terpineol (manufactured by Wako Pure Chemical Industries, Ltd.) and 1.12 g of isobornyl cyclohexanol (MTPH, manufactured by Nippon Terpene Chemicals, Inc.) as a dispersion medium, 0.88 g of CH-0200 (surface treatment agent: lauric acid, manufactured by MITSUI MINING & SMELTING CO., LTD.) as sub-micro copper particles, and 7.92 g of MA-C025 (manufactured by MITSUI MINING & SMELTING CO., LTD.) as micro copper particles were kneaded with an agitate mortar until a dry powder disappeared, and the resultant mixed solution was put into a plastic bottle. The same method as in Preparation Example 1 was performed except that this mixed solution was used, thereby preparing copper paste for joining 14.

Preparation Example 15

1.20 g of α-terpineol (manufactured by Wako Pure Chemical Industries, Ltd.) as a dispersion medium, and 8.80 g of CH-0200 (surface treatment agent: lauric acid, manufactured by MITSUI MINING & SMELTING CO., LTD.) as sub-micro copper particles were kneaded with an agitate mortar until a dry powder disappeared, and the resultant mixed solution was put into a plastic bottle. The same method as in Preparation Example 1 was performed except that this mixed solution was used, thereby preparing copper paste for joining 15.

Preparation Example 16

1.50 g of α-terpineol (manufactured by Wako Pure Chemical Industries, Ltd.) as a dispersion medium, 5.95 g of CS-10 (surface treatment agent: unclear, manufactured by MITSUI MINING & SMELTING CO., LTD., 50% volume-average particle size: 1.1 μm, a ratio (% by mass) of particles having a particle size of 0.12 to 0.8 μm: 18%) as cooper particles, and 2.55 g of MA-C025 (manufactured by MITSUI MINING & SMELTING CO., LTD.) as micro copper particles were kneaded with an agitate mortar until a dry powder disappeared, and the resultant mixed solution was put into a plastic bottle. The same method as in Preparation Example 1 was performed except that this mixed solution was used, thereby preparing copper paste for joining 16.

Preparation Example 17

1.06 g of α-terpineol (manufactured by Wako Pure Chemical Industries, Ltd.) as a dispersion medium, 6.37 g of Cu-HWQ 1.5 μm (surface treatment agent: none, manufactured by FUKUDA METAL FOIL & POWDER CO., LTD., 50% volume-average particle size: 1.7 μm, a ratio (% by mass) of particles having a particle size of 0.12 to 0.8 μm: 11%) as cooper particles, and 2.73 g of MA-C025 (manufactured by MITSUI MINING & SMELTING CO., LTD.) as micro copper particles were kneaded with an agitate mortar until a dry powder disappeared, and the resultant mixed solution was put into a plastic bottle. The same method as in Preparation Example 1 was performed except that this mixed solution was used, thereby preparing copper paste for joining 17.

Preparation Example 18

0.67 g of α-terpineol (manufactured by Wako Pure Chemical Industries, Ltd.) and 0.60 g of isobornyl cyclohexanol (MTPH, manufactured by Nippon Terpene Chemicals, Inc.) as a dispersion medium, 6.17 g of Cu-HWQ 3.0 μm (surface treatment agent: none, manufactured by FUKUDA METAL FOIL & POWDER CO., LTD., 50% volume-average particle size: 3 μm, a ratio (% by mass) of particles having a particle size of 0.12 to 0.8 μm: 0.3%) and 2.64 g of MA-C025 (manufactured by MITSUI MINING & SMELTING CO., LTD.) as micro copper particles were kneaded with an agitate mortar until a dry powder disappeared, and the resultant mixed solution was put into a plastic bottle. The same method as in Preparation Example 1 was performed except that this mixed solution was used, thereby preparing copper paste for joining 18.

<Manufacturing of Joined Body>

Examples 1 to 11, and 16

Joined bodies were prepared by using the copper paste for joining 1 to the copper paste for joining 12 in accordance with the following method. The die shear strength of the joined bodies was measured by a method to be described later.

A stainless steel metal mask (thickness: 100 μm) including square openings of 3 mm×3 mm in 3 rows×3 columns was placed on a copper plate (thickness: 3 mm) of 19 mm×25 mm, and the copper paste for joining was applied through stencil printing using a metal squeegee. A copper block (thickness: 250 μm) of which a joining surface of 2 mm×2 mm was plated with nickel was placed on the copper paste for joining that was applied, and the copper block was slightly pressed with a pincette. The resultant laminated body was set in a tube furnace (manufactured by AVC Co., Ltd), and an argon gas was allowed to flow at a flow rate of 3 L/min to substitute air with the argon gas. Then, a temperature was raised for 10 minutes while allowing a hydrogen gas to flow at a flow rate of 300 ml/min. After temperature rising, sintering was performed under conditions in which the highest temperature reached was set to 350° C., and a retention time of the highest temperature reached was set to 10 minutes, thereby obtaining a joined body in which the copper plate and the nickel-plated copper block were joined to each other. After the sintering, the flow rate of the argon gas was changed to 0.3 L/min, and cooling was performed. Then, the joined body, which was cooled to 50° C. or lower, was taken out into the air.

Example 12

A joined body was prepared by using the copper paste for joining 4 in accordance with the following method. The die shear strength of the joined body was measured by a method to be described later.

A stainless steel metal mask (thickness: 100 μm) including square openings of 3 mm×3 mm in 3 rows×3 columns was placed on a copper plate (thickness: 3 mm) of 19 mm×25 mm, and the copper paste for joining was applied through stencil printing using a metal squeegee. A copper block (thickness: 250 μm) of which a joining surface of 2 mm×2 mm was plated with gold was placed on the copper paste for joining that was applied, and the copper block was slightly pressed with a pincette. The resultant laminated body was set in a tube furnace (manufactured by AVC Co., Ltd), and an argon gas was allowed to flow at a flow rate of 3 L/min to substitute air with the argon gas. Then, a temperature was raised for 10 minutes while allowing a hydrogen gas to flow at a flow rate of 300 ml/min. After temperature rising, sintering was performed under conditions in which the highest temperature reached was set to 350° C., and a retention time of the highest temperature reached was set to 10 minutes, thereby obtaining a joined body in which the copper plate and the gold-plated copper block were joined to each other. After the sintering, the flow rate of the argon gas was changed to 0.3 L/min, and cooling was performed. Then, the joined body, which was cooled to 50° C. or lower, was taken out into the air.

Example 13

A joined body was prepared by using the copper paste for joining 4 in accordance with the following method. The die shear strength of the joined bodies was measured by a method to be described later.

A stainless steel metal mask (thickness: 100 μm) including square openings of 3 mm×3 mm in 3 rows×3 columns was placed on a copper plate (thickness: 3 mm) of 19 mm×25 mm, and the copper paste for joining was applied through stencil printing using a metal squeegee. A copper block (thickness: 250 μm) of which a joining surface of 2 mm×2 mm was plated with nickel was placed on the copper paste for joining that was applied, and the copper block was slightly pressed with a pincette. An SUS block (weight: 15 g) of 15 mm×15 mm was left to stand on the copper block to overlap nine sheets of copper blocks (thickness: 250 μm) of which a joining surface of 2 mm×2 mm was plated with nickel. The resultant laminated body was set in a tube furnace (manufactured by AVC Co., Ltd), and an argon gas was allowed to flow at a flow rate of 3 L/min to substitute the air with the argon gas. Then, a temperature was raised for 10 minutes while allowing a hydrogen gas to flow at a flow rate of 300 ml/min. After temperature rising, sintering was performed under conditions in which the highest temperature reached was set to 350° C., and a retention time of the highest temperature reached was set to 10 minutes, thereby obtaining a joined body in which the copper plate and the nickel-plated copper block were joined to each other. After the sintering, the flow rate of the argon gas was changed to 0.3 L/min, and cooling was performed. Then, the joined body, which was cooled to 50° C. or lower, was taken out into the air.

Example 14

A joined body was prepared by using the copper paste for joining 4 in accordance with the following method. The die shear strength of the joined bodies was measured by a method to be described later.

A stainless steel metal mask (thickness: 100 μm) including square openings of 3 mm×3 mm in 3 rows×3 columns was placed on a copper plate (thickness: 3 mm) of 19 mm×25 mm, and the copper paste for joining was applied through stencil printing using a metal squeegee. A copper block (thickness: 250 μm) of which a joining surface of 2 mm×2 mm was plated with nickel was placed on the copper paste for joining that was applied, and the resultant laminated body was set in a tube furnace (manufactured by AVC Co., Ltd), and an argon gas was allowed to flow at a flow rate of 3 L/min to substitute air with the argon gas. Then, a temperature was raised for 10 minutes while allowing a hydrogen gas to flow at a flow rate of 300 ml/min After temperature rising, sintering was performed under conditions in which the highest temperature reached was set to 250° C., and a retention time of the highest temperature reached was set to 60 minutes, thereby obtaining a joined body in which the copper plate and the nickel-plated copper block were joined to each other. After the sintering, the flow rate of the argon gas was changed to 0.3 L/min, and cooling was performed. Then, the joined body, which was cooled to 50° C. or lower, was taken out into the air.

Example 15

A joined body was prepared by using the copper paste for joining 4 in accordance with the following method. The die shear strength of the joined bodies was measured by a method to be described later.

A stainless steel metal mask (thickness: 100 μm) including square openings of 3 mm×3 mm in 3 rows×3 columns was placed on a copper plate (thickness: 3 mm) of 19 mm×25 mm, and the copper paste for joining was applied through stencil printing using a metal squeegee. A copper block (thickness: 250 μm) of which a joining surface of 2 mm×2 mm was plated with nickel was placed on the copper paste for joining that was applied, and the resultant laminated body was set in a tube furnace (manufactured by AVC Co., Ltd), and an argon gas was allowed to flow at a flow rate of 3 L/min to substitute air with the argon gas. Then, a temperature was raised for 20 minutes while allowing a hydrogen gas to flow at a flow rate of 300 ml/min After temperature rising, sintering was performed under conditions in which the highest temperature reached was set to 450° C., and a retention time of the highest temperature reached was set to 10 minutes, thereby obtaining a joined body in which the copper plate and the nickel-plated copper block were joined to each other. After the sintering, the flow rate of the argon gas was changed to 0.3 L/min, and cooling was performed. Then, the joined body, which was cooled to 50° C. or lower, was taken out into the air.

Comparative Examples 1 to 6

A joined body was prepared by the same method as in Example 1 except that the copper paste for joining 13 to the copper paste for joining 18 were used. The die shear strength of the joined bodies was measured by a method to be described later.

<Measurement Method>
(Die Shear Strength)

The joining strength of the joined bodies was evaluated by the die shear strength. The die shear strength was measured as follows. The copper block of each of the joined bodies was pressed in a horizontal direction by using a full-universal type bond glue tester (4000 series, manufactured by DAGE corporation) attached with a DS-100 load cell at a measurement speed of 5 mm/min and a measurement height of 50 μm. An average value of values obtained by measuring eight joined bodies was set as the die shear strength.

(50% Volume-Average Particle Size)

50% volume-average particle size was measured by using a shimadzu nano particle size distribution measuring apparatus (SALD-7500 nano, manufactured by Shimadzu Corporation) and accessary software (WingSALDII-7500—for Japanese V3, manufactured by Shimadzu Corporation) in accordance with (1) to (5) to be described below.

(1) Software Setting

WingSALDII-7500—for Japanese V3.1 was activated in an accessary personal computer of the measurement apparatus, and a manual was pressed to initiate the apparatus. After termination of initialization, a retention file name was designated and "next" was clicked to set measurement conditions and particle size distribution calculation conditions as follows. Then, "next" was clicked.

(Measurement Conditions)

Detection of Diffracted/Scattered Light

Average number of times (number of times of measurement): 128, the number of times of measurement: 1, measurement interval (second): 2

Measurement Light Absorption Range

Maximum value: 0.2, minimum value: 0

Blank region/measurement region

Blank measurement permissible fluctuation maximum value: 150, measurement optimal range (MAX): 45000, measurement optimal range (MIN): 15000

(Particle Size Distribution Calculation Condition)

Selection of refractive index: reference sample/pure metal/semiconductor and the like (solid value)

Material of sample: 4 Copper (copper)

Selection of refractive index: 1.18 to 2.21 "lateral/backward sensors are evaluated" was checked (2) Blank Measurement Measurement was performed by attaching a shimadzu nano particle size distribution measuring apparatus (SALD-7500 nano, manufactured by Shimadzu Corporation) to SALD-7500 nano. α-terpineol (manufactured by Wako Pure Chemical Industries, Ltd.) was added dropwise into a funnel-attached batch cell (part number S347-61030-41, manufactured by Shimadzu Corporation, hereinafter, referred to as "batch cell"), which is an accessary of SALD-BC75, with a syringe in such a manner that the α-terpineol exists between two marked lines of the batch cell. "Diagnosis" and "adjustment" were selected on a screen of WingSALDII-7500—for Japanese V3 to confirm that a positional sensor output was in an apparatus-permissible range. "Cancel (removal)" was clicked to return to the original screen, and blank measurement was selected to perform measurement.

(3) Preparation Measurement Solution 2 mg of copper paste for joining to be measured was placed on a stirring lever of a batch cell holder (part number S347-62301, manufactured by Shimadzu Corporation) which is an accessary of SALD-BC75, and was set in a funnel-attached batch cell. Next, "stirrer" was selected on the screen of WingSALDII-7500—for Japanese V3 to perform stirring for 15 minutes.

(4) Measurement

After stirring, "measurement" was selected on the screen of WingSALDII-7500—for Japanese V3 to perform measurement. Operations of (1) to (4) were repeated four times to perform measurement four times.

(5) Statistics

WingSALDII-7500—for Japanese V3 was activated, and "open" was clicked to select a measured file. Measurement data was displayed on the screen of WingSALDII-7500—for Japanese V3. "Overlay drawing" was clicked to display 50.000% diameter on a lower state of the screen, and an average value of four times was set as the 50% volume-average particle size.

Results of Examples and Comparative Examples are illustrated in Tables 1 to 3.

TABLE 1

| | | Example 1 | Example 2 | Example 3 | Example 4 | Example 5 | Example 6 |
|---|---|---|---|---|---|---|---|
| | Copper paste for joining | 1 | 2 | 3 | 4 | 5 | 6 |
| Micro copper particles | Aspect ratio | 6.6 | 6.6 | 6.6 | 6.6 | 6.6 | 29.5 |
| | 50% volume-average particle size (μm) | 7.5 | 7.5 | 7.5 | 7.5 | 7.5 | 8 |
| | Ratio of particles having particle size of 2 to 50 μm (% by mass) | 100 | 100 | 100 | 100 | 100 | 100 |
| | Addition amount (g) | 5.28 | 4.4 | 3.52 | 2.64 | 0.88 | 2.75 |
| Sub-micro copper particles | Amount of organic acid contained (% by mass) | 0.97 | 0.97 | 0.97 | 0.97 | 0.97 | 0.97 |
| | Ratio of particles having particle size of 0.12 to 0.8 μm (% by mass) | 100 | 100 | 100 | 100 | 100 | 100 |
| | 50% volume-average particle size (μm) | 0.36 | 0.36 | 0.36 | 0.36 | 0.36 | 0.36 |
| | Addition amount (g) | 3.52 | 4.4 | 5.28 | 6.16 | 7.91 | 6.4 |
| Mass ratio of micro copper particles and sub-micro copper particles with respect to total mass of metal particles (% by mass) | | 100 | 100 | 100 | 100 | 100 | 100 |
| Weight ratio of micro copper particles with respect to total mass of micro copper particles and sub-micro copper particles (% by mass) | | 60 | 50 | 40 | 30 | 20 | 30 |
| Weight ratio sub-micro copper particles with respect to total mass of micro copper particles and sub-micro copper particles (% by mass) | | 40 | 50 | 60 | 70 | 80 | 70 |
| Dispersion medium | α-terpineol (g) | 0.35 | 0.44 | 0.52 | 0.61 | 0.78 | 0.9 |
| | MTPH (g) | 0.85 | 0.76 | 0.68 | 0.59 | 0.42 | 0 |
| Adherend | Surface material of semiconductor member | Nickel | Nickel | Nickel | Nickel | Nickel | Nickel |
| | Surface material of metal substrate | Copper | Copper | Copper | Copper | Copper | Copper |
| Joining conditions | Highest temperature reached (° C.) | 350 | 350 | 350 | 350 | 350 | 350 |
| | Retention time of highest temperature reached (minutes) | 10 | 10 | 10 | 10 | 10 | 10 |
| | Pressurizing force (MPa) | 0 | 0 | 0 | 0 | 0 | 0 |
| Characteristics | Die shear strength at 25° C. (MPa) | 22.6 | 28.5 | 33.2 | 38.3 | 25.8 | 26.6 |

TABLE 1-continued

|  |  | Example 7 | Example 8 | Example 9 | Example 10 | Example 11 |
|---|---|---|---|---|---|---|
| Copper paste for joining |  | 7 | 8 | 9 | 10 | 11 |
| Micro copper particles | Aspect ratio | 11.4 | 1 | 6.6 | 6.6 | 6.6 |
|  | 50% volume-average particle size (μm) | 3.8 | 3 | 7.5 | 7.5 | 7.5 |
|  | Ratio of particles having particle size of 2 to 50 μm (% by mass) | 100 | 97 | 100 | 100 | 100 |
|  | Addition amount (g) | 4.58 | 2.64 | 2.64 | 6.16 | 0.88 |
| Sub-micro copper particles | Amount of organic acid contained (% by mass) | 0.97 | 0.97 | 0.63 | 0.97 | 0.97 |
|  | Ratio of particles having particle size of 0.12 to 0.8 μm (% by mass) | 100 | 100 | 100 | 100 | 100 |
|  | 50% volume-average particle size (μm) | 0.36 | 0.36 | 0.41 | 0.36 | 0.36 |
|  | Addition amount (g) | 4.58 | 6.16 | 6.16 | 2.64 | 7.92 |
| Mass ratio of micro copper particles and sub-micro copper particles with respect to total mass of metal particles (% by mass) |  | 100 | 100 | 100 | 100 | 100 |
| Weight ratio of micro copper particles with respect to total mass of micro copper particles and sub-micro copper particles (% by mass) |  | 50 | 30 | 30 | 70 | 10 |
| Weight ratio sub-micro copper particles with respect to total mass of micro copper particles and sub-micro copper particles (% by mass) |  | 50 | 70 | 70 | 30 | 90 |
| Dispersion medium | α-terpineol (g) | 0.9 | 0.61 | 0.61 | 0.94 | 0.78 |
|  | MTPH (g) | 0 | 0.59 | 0.59 | 0.26 | 0.42 |
| Adherend | Surface material of semiconductor member | Nickel | Nickel | Nickel | Nickel | Nickel |
|  | Surface material of metal substrate | Copper | Copper | Copper | Copper | Copper |
| Joining conditions | Highest temperature reached (° C.) | 350 | 350 | 350 | 350 | 350 |
|  | Retention time of highest temperature reached (minutes) | 10 | 10 | 10 | 10 | 10 |
|  | Pressurizing force (MPa) | 0 | 0 | 0 | 0 | 0 |
| Characteristics | Die shear strength at 25° C. (MPa) | 21.6 | 32 | 21 | 18.9 | 13.4 |

TABLE 2

|  |  | Example 12 | Example 13 | Example 14 | Example 15 | Example 16 |
|---|---|---|---|---|---|---|
| Copper paste for joining |  | 4 | 4 | 4 | 4 | 12 |
| Micro copper particles | Aspect ratio | 6.6 | 6.6 | 6.6 | 6.6 | 6.6 |
|  | 50% volume-average particle size (μm) | 7.5 | 7.5 | 7.5 | 7.5 | 7.5 |
|  | Ratio of particles having particle size of 2 to 50 μm (% by mass) | 100 | 100 | 100 | 100 | 100 |
|  | Addition amount (g) | 2.64 | 2.64 | 2.64 | 2.64 | 3 |
| Sub-micro copper particles | Amount of organic acid contained (% by mass) | 0.97 | 0.97 | 0.97 | 0.97 | 0.57 |
|  | 50% volume-average particle size (μm) | 0.36 | 0.36 | 0.36 | 0.36 | 0.72 |
|  | Ratio of particles having particle size of 0.12 to 0.8 μm (% by mass) | 100 | 100 | 100 | 100 | 80 |
|  | Addition amount (g) | 6.16 | 6.16 | 6.16 | 6.16 | 7 |
| Mass ratio of micro copper particles and sub-micro copper particles with respect to total mass of metal particles (% by mass) |  | 100 | 100 | 100 | 100 | 100 |
| Weight ratio of micro copper particles with respect to total mass of micro copper particles and sub-micro copper particles (% by mass) |  | 30 | 30 | 30 | 30 | 30 |
| Weight ratio sub-micro copper particles with respect to total mass of micro copper particles and sub-micro copper particles (% by mass) |  | 70 | 70 | 70 | 70 | 70 |
| Dispersion medium | α-terpineol (g) | 0.61 | 0.61 | 0.61 | 0.61 | 1.2 |
|  | MTPH (g) | 0.59 | 0.59 | 0.59 | 0.59 | 0 |
| Adherend | Surface material of semiconductor member | Gold | Nickel | Nickel | Nickel | Nickel |
|  | Surface material of metal substrate | Copper | Copper | Copper | Copper | Copper |

TABLE 2-continued

|  |  | Example 12 | Example 13 | Example 14 | Example 15 | Example 16 |
|---|---|---|---|---|---|---|
| Joining conditions | Highest temperature reached (° C.) | 350 | 350 | 250 | 450 | 350 |
|  | Retention time of highest temperature reached (minutes) | 10 | 10 | 60 | 10 | 10 |
|  | Pressurizing force (MPa) | 0 | 0.0042 | 0 | 0 | 0 |
| Characteristics | Die shear strength at 25° C. (MPa) | 31.6 | 50 or greater | 28.5 | 44.5 | 9.2 |

TABLE 3

|  |  | Comparative Example 1 | Comparative Example 2 | Comparative Example 3 | Comparative Example 4 | Comparative Example 5 | Comparative Example 6 |
|---|---|---|---|---|---|---|---|
|  | Copper paste for joining | 13 | 14 | 15 | 16 | 17 | 18 |
| Micro copper particles | Aspect ratio | 6.6 | 6.6 | — | 6.6 | 6.6 | 6.6 |
|  | 50% volume-average particle size (μm) | 7.5 | 7.5 | — | 7.5 | 7.5 | 7.5 |
|  | Ratio of particles having particle size of 2 to 50 μm (% by mass) | 100 | 100 | — | 100 | 100 | 100 |
|  | Addition amount (g) | 8.8 | 7.92 | 0 | 2.55 | 2.73 | 2.64 |
| Sub-micro copper particles | Amount of organic acid contained (% by mass) | — | 0.97 | 0.97 | — | — | — |
|  | Ratio of particles having particle size of 0.12 to 0.8 μm (% by mass) | — | 0.36 | 0.36 | — | — | — |
|  | 50% volume-average particle size (μm) | — | 100 | 100 | — | — | — |
|  | Addition amount (g) | 0 | 0.88 | 8.8 | — | — | — |
| Other copper particles | Amount of organic acid contained (% by mass) | — | — | — | 0.2 | 0 | — |
|  | 50% volume-average particle size (μm) | — | — | — | 1.1 | 1.7 | — |
|  | Addition amount (g) | — | — | — | 5.95 | 6.37 | — |
| Second micro copper particles | Aspect ratio | — | — | — | — | — | 1 |
|  | 50% volume-average particle size (μm) | — | — | — | — | — | 3 |
|  | Ratio of particles having particle size of 2 to 50 μm (% by mass) | — | — | — | — | — | 97 |
|  | Addition amount (g) | — | — | — | — | — | 6.17 |
| Mass ratio of micro copper particles and sub-micro copper particles with respect to total mass of metal particles (% by mass) |  | 100 | 100 | 100 | 100 | 100 | 100 |
| Weight ratio of micro copper particles with respect to total mass of micro copper particles and sub-micro copper particles (% by mass) |  | 100 | 90 | 0 | 100 | 100 | 100 |
| Weight ratio sub-micro copper particles with respect to total mass of micro copper particles and sub-micro copper particles (% by mass) |  | 0 | 10 | 100 | 0 | 0 | 0 |
| Dispersion medium | α-terpineol (g) | 1.2 | 0.22 | 1.2 | 1.5 | 1.06 | 0.67 |
|  | MTPH (g) | 0 | 1.12 | 0 | 0 | 0 | 0.6 |
| Adherend | Surface material of semiconductor member | Nickel | Nickel | Nickel | Nickel | Nickel | Nickel |
|  | Surface material of metal substrate | Copper | Copper | Copper | Copper | Copper | Copper |
| Joining conditions | Highest temperature reached (° C.) | 350 | 350 | 350 | 350 | 350 | 350 |
|  | Retention time of highest temperature reached (minutes) | 10 | 10 | 10 | 10 | 10 | 10 |
|  | Pressurizing force (MPa) | 0 | 0 | 0 | 0 | 0 | 0 |
| Characteristics | Die shear strength at 25° C. (MPa) | 0.3 | 5.5 | 0.4 | 3 | Less than 1 | Less than 1 |

When comparing Examples and Comparative Examples with each other, it can be seen that a mass ratio of the sub-micro copper particles and the micro copper particles has an effect on the die shear strength. The reason for this is considered as follows. When the micro copper particles excessively increase, a filling rate of a sintered copper layer decreases, and a lot of voids are likely to occur in a sintered body, and thus the die shear strength is lowered. On the other hand, when the sub-micro copper particles excessively increase, a lot of voids are likely to occur in the sintered body due to volume shrinkage, and thus the die shear strength is lowered. In addition, from the results of Examples, it can be seen that when a mass ratio of the sub-micro copper particles and the micro copper particles is appropriate, the sintered body of the copper paste for joining is strongly joined with any one of gold, nickel, and copper, and exhibits satisfactory die shear strength. In addition, in Example 13, the joined body was manufactured under conditions in which a pressure of 0.0042 MPa in addition to the own weight of the copper block was applied to the copper paste for joining. As a result, it is considered that voids collapse and decrease during joining, and thus it was possible to perform joining in a stronger manner, and the die shear strength increased. In Example 15, the highest temperature reached was 450° C. As a result, it is considered that sintering of the copper paste for joining further progressed in comparison to Example 4, and thus the die shear strength became further satisfactory. In Comparative Examples 4 to 6, the volume-average particle size of the sub-micro copper particles was excessively large. As a result, it is considered that sinterability of the copper paste for joining deteriorated, and thus the die shear strength of the joined body deteriorated.

(Cross-Section Morphology Observation)

The joined body was fixed to the inside of a cup with a sample clip (samplklip I, manufactured by Buehler), and an epoxy casting resin (Epomount, manufactured by Refine Tec Ltd.) was poured to the periphery of the joined body until the entirety of a sample was embedded, and the cup was left to stand in a vacuum desiccator, and a pressure was reduced for 1 minute for defoaming. Then, the sample was left as is at room temperature (25° C.) for 10 hours to cure the epoxy casting resin. The casted joined body was cut in the vicinity of a cross-section to be observed by using a diamond cutting wheel (11-304, manufactured by Refine Tec Ltd.)-attached Refine Saw•Lo (RCA-005, manufactured by Refine Tec Ltd.). The cross-section was ground by using water-resistant abrasive paper (Carbomac paper, manufactured by Refine Tec Ltd.)-attached polishing apparatus (Refine Polisher Hv, manufactured by Refine Tec Ltd.) so that a silicon chip has a crack-free cross-section. In addition, an excessive casting resin was ground to a size capable of being fitted into a cross-section polisher (CP) processing apparatus. A cross-section of the cut sample was processed by performing cross-section polishing with a CP processing apparatus (IM4000, manufactured by Hitachi High-Technologies Corporation) under conditions of an acceleration voltage of 6 kV, an argon gas flow rate of 0.07 to 0.1 cm$^3$/min, and a processing time of 2 hours. Platinum was sputtered to the cross-section in a thickness of 10 nm by using a sputtering apparatus (ION SPUTTER, manufactured by Hitachi High-Technologies Corporation), and the resultant sample was set as a sample for SEM observation. The sample for SEM was observed with a SEM apparatus (ESEM XL30, manufactured by PHILIPS) at an application voltage of 10 kV to observe a cross-section of the joined body.

Figure 10:
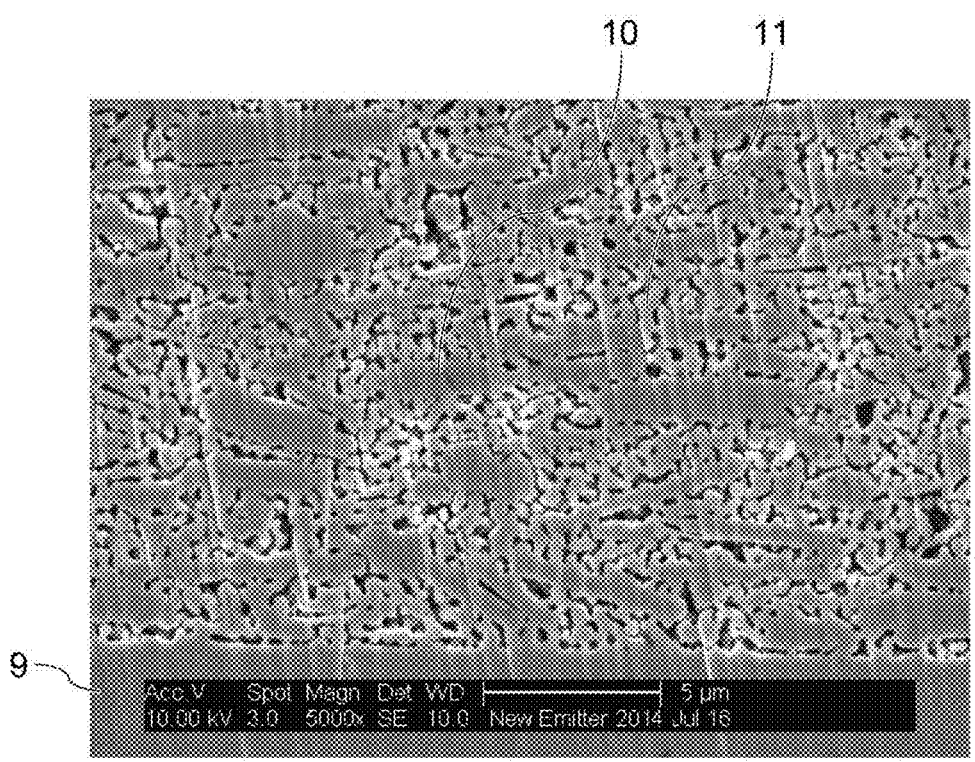
FIG. 10 illustrates a SEM image of a cross-section of a joined body in Example 1.
Figure 11:
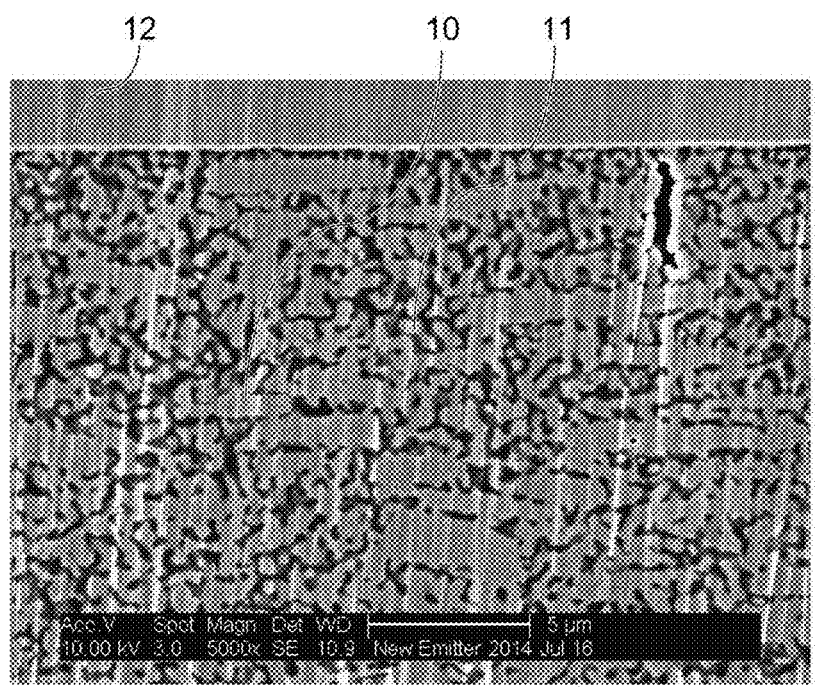
FIG. 11 illustrates a SEM image of a cross-section of a joined body in Example 12.
Figure 12:
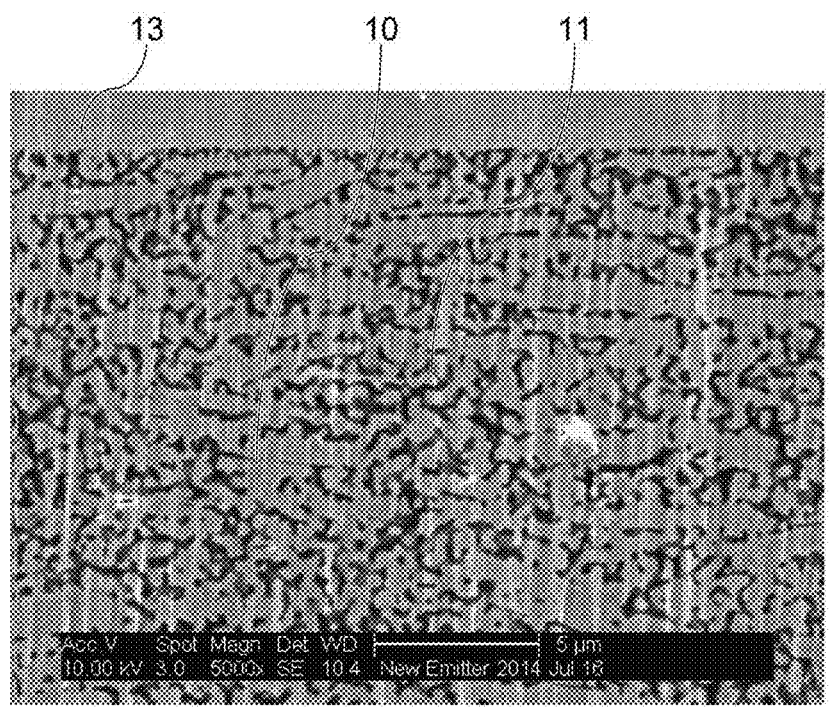
FIG. 12 illustrates a SEM image of a cross-section of a joined body in Example 13.
Figure 13:
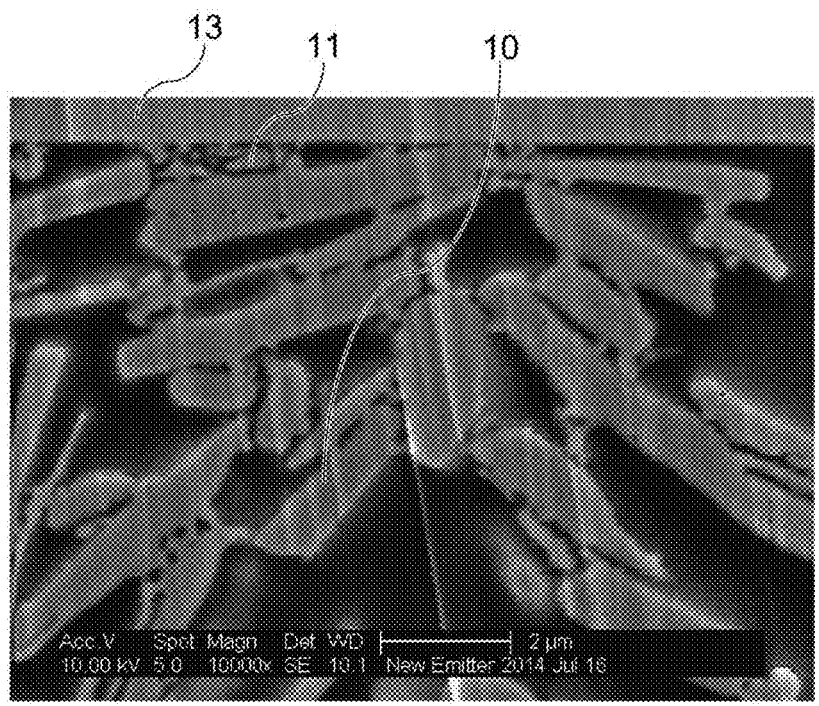
FIG. 13 illustrates a SEM image of a cross-section of a joined body in Comparative Example 2.

FIG. 10 illustrates a SEM image of a cross-section of the joined body in Example 1. FIG. 11 illustrates a SEM image of a cross-section of the joined body in Example 12. FIG. 12 illustrates a SEM image of a cross-section in Example 13. FIG. 13 illustrates a SEM image of a cross-section of the joined body in Comparative Example 2. From FIGS. 10 to 12, with regard to the sintered body of the copper paste for joining, it can be seen that a copper plate 9, and a gold-plated copper block 12 and a nickel-plated copper block 13 can be joined with each other through a sintered body 10 of micro copper particles and a sintered body 11 of sub-micro copper particles. In addition, from FIGS. 10 to 12, in a case where a mass ratio between the sub-micro copper particles and the micro copper particles is appropriate, it can be seem that the micro copper particles orient in approximately parallel to a joining surface, and vacancies are filled with the sub-micro copper particles. On the other hand, from FIG. 13, in a case where the sub-micro copper particles are excessively smaller in comparison to the micro copper particles, it can be seen that vacancies between the micro copper particles are not sufficiently filled with the sub-micro copper particles. Due to this difference in a structure, in the joined body of Comparative Example 2, it is considered that sufficient die shear strength was not obtained.

REFERENCE SIGNS LIST

1: Sintered body of copper paste for joining, 2: First member, 3: Second member, 5a, 5b: Lead frame, 6: Wire, 7: Mold resin, 8: Semiconductor element, 9: Copper plate, 10: Sintered body of micro copper particles, 11: Sintered body of sub-micro copper particles, 12: Gold-plated copper block, 13: Nickel-plated copper block, 100: Joined body, 110: Semiconductor device, 21: Insulating substrate, 22: First electrode, 23: Semiconductor element, 24: Second electrode, 25: Metal interconnection, 26: Third electrode, 27: Wire, 28: Copper plate, 29: Insulator, 30: Block body, 31: Sealing material, 32: First thermal conduction member, 33: Second thermal conduction member, 34: Electrode, 35: Wire, 200: Semiconductor device, 210: Semiconductor device, 220: Semiconductor device, 300: Semiconductor device, 310: Semiconductor device, 320: Semiconductor device, 400: Semiconductor device.

The invention claimed is:

1. Copper paste for joining, comprising:
   metal particles; and
   a dispersion medium,
   wherein the metal particles include sub-micro copper particles having a volume-average particle size of 0.12 μm to 0.8 μm, and micro copper particles having a volume-average particle size of 2 μm to 50 μm,
   a sum of the amount of the sub-micro copper particles contained and the amount of the micro copper particles contained is 80% by mass or greater on the basis of a total mass of the metal particles, and
   the amount of the sub-micro copper particles contained is 30% by mass to 90% by mass on the basis of a sum of a mass of the sub-micro copper particles and a mass of the micro copper particles.

2. The copper paste for joining according to claim 1, wherein the micro copper particles have a flake shape.

3. The copper paste for joining according to claim 1, wherein the copper paste for joining is used without pressurization.

4. A method for manufacturing a joined body, comprising:
   a process of preparing a laminated body in which a first member, and the copper paste for joining according to claim 1 and a second member that are disposed on a side whereon a weight of the first member acts, are laminated in this order; and sintering the copper paste for joining in a state of receiving the weight of the first member, or the weight of the first member and a pressure of 0.01 MPa or lower.

5. A method for manufacturing a semiconductor device, comprising:
   a process of preparing a laminated body in which a first member, and the copper paste for joining according to claim 1 and a second member that are disposed on a side whereon a weight of the first member acts, are laminated in this order; and sintering the copper paste for joining in a state of receiving the weight of the first member, or the weight of the first member and a pressure of 0.01 MPa or lower,
   wherein at least one of the first member and the second member is a semiconductor element.

6. A joined body, comprising:
   a first member;
   a second member; and
   a sintered body of the copper paste for joining according to claim 1, the sintered body joining the first member and the second member.

7. The joined body according to claim 6, wherein at least one of the first member and the second member includes at least one metal selected from the group consisting of copper, nickel, silver, gold, and palladium on a surface that is in contact with the sintered body.

8. A semiconductor device, comprising:
   a first member;
   a second member; and
   a sintered body of the copper paste for joining according to claim 1, the sintered body joining the first member and the second member,
   wherein at least one of the first member and the second member is a semiconductor element.

9. The copper paste for joining according to claim 2, wherein the copper paste for joining is used without pressurization.

* * * * *